(12) United States Patent
Koyama

(10) Patent No.: US 7,372,437 B2
(45) Date of Patent: *May 13, 2008

(54) DRIVE CIRCUIT, DISPLAY DEVICE USING THE DRIVE CIRCUIT AND ELECTRONIC APPARATUS USING THE DISPLAY DEVICE

(75) Inventor: Jun Koyama, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 282 days.

This patent is subject to a terminal disclaimer.

(21) Appl. No.: 10/885,881

(22) Filed: Jul. 8, 2004

(65) Prior Publication Data

US 2004/0257356 A1 Dec. 23, 2004

Related U.S. Application Data

(63) Continuation of application No. 10/267,308, filed on Oct. 8, 2002, now Pat. No. 6,777,885.

(30) Foreign Application Priority Data

Oct. 12, 2001 (JP) ............................. 2001-316116

(51) Int. Cl.
*G09G 3/30* (2006.01)

(52) U.S. Cl. .............................. 345/76; 345/7; 345/84; 345/92; 345/204; 315/169.1; 315/169.3

(58) Field of Classification Search ............ 345/76–96, 345/204–215, 7–9, 92; 315/169.1–169.5
See application file for complete search history.

(56) References Cited

U.S. PATENT DOCUMENTS 3,696,393 A 10/1972 McDonald 3,982,172 A 9/1976 van de Plassche (Continued)

FOREIGN PATENT DOCUMENTS

EP          0359315          3/1990

(Continued)

OTHER PUBLICATIONS

D. Groeneveld et al., "A Self-Calibration Technique for Monolithic High-Resolution D/A Convertors", IEEE Journal of solid-state Circuits, vol. 24, No. 6, 1989, pp. 1517-1522.

(Continued)

*Primary Examiner*—Vijay Shankar
(74) *Attorney, Agent, or Firm*—Fish & Richardson P.C.

(57) ABSTRACT

The currents that m pieces of quasi control current output circuits formed with a polycrystalline TFT output have the dispersion. In the present invention, the averaged value of the output currents of these m pieces of the quasi control current output circuits is outputted from the output terminals of n (n represents a natural number of m or less) of the control current output circuit. For example, the output currents of these m pieces of the quasi control current output circuits are in turn exchanged and outputted from the n (n represents a natural number of m or less) pieces of the output terminals of the control current output circuits. Thus, the drive circuit, which has suppressed the dispersion of the output current, can be provided.

32 Claims, 23 Drawing Sheets

U.S. PATENT DOCUMENTS

| | | | |
|---|---|---|---|
| 4,967,140 A | | 10/1990 | Groeneveld et al. |
| 5,138,310 A | | 8/1992 | Hirane et al. |
| 5,266,936 A | | 11/1993 | Saitoh |
| 5,594,463 A | | 1/1997 | Sakamoto |
| 5,619,228 A | * | 4/1997 | Doherty ............ 345/693 |
| 5,680,149 A | * | 10/1997 | Koyama et al. ....... 345/98 |
| 5,719,589 A | | 2/1998 | Norman et al. |
| 5,805,123 A | | 9/1998 | Satoh et al. |
| 5,923,309 A | | 7/1999 | Ishizuka et al. |
| 5,942,856 A | * | 8/1999 | Koyama ............ 315/169.3 |
| 5,953,003 A | | 9/1999 | Kwon et al. |
| 5,973,661 A | | 10/1999 | Kobayashi et al. |
| 5,990,629 A | | 11/1999 | Yamada et al. |
| 6,020,865 A | | 2/2000 | Okuda et al. |
| 6,037,888 A | | 3/2000 | Nairn |
| 6,057,183 A | | 5/2000 | Koyama et al. |
| 6,091,203 A | | 7/2000 | Kawashima et al. |
| 6,150,877 A | | 11/2000 | Morikawa |
| 6,222,357 B1 | | 4/2001 | Sakuragi |
| 6,229,506 B1 | | 5/2001 | Dawson et al. |
| 6,268,842 B1 | | 7/2001 | Yamazaki et al. |
| 6,310,589 B1 | | 10/2001 | Nishigaki et al. |
| 6,317,138 B1 | | 11/2001 | Yano et al. |
| 6,331,830 B1 | | 12/2001 | Song et al. |
| 6,331,844 B1 | | 12/2001 | Okumura et al. |
| 6,339,391 B1 | | 1/2002 | Chung et al. |
| 6,344,843 B1 | | 2/2002 | Koyama et al. |
| 6,351,075 B1 | | 2/2002 | Yoshida et al. |
| 6,369,516 B1 | | 4/2002 | Iketsu et al. |
| 6,369,786 B1 | | 4/2002 | Suzuki |
| 6,373,454 B1 | | 4/2002 | Knapp et al. |
| 6,465,806 B2 | | 10/2002 | Kubota et al. |
| 6,473,064 B1 | | 10/2002 | Tsuchida et al. |
| 6,476,779 B1 | | 11/2002 | Yano et al. |
| 6,501,466 B1 | | 12/2002 | Yamagishi et al. |
| 6,545,652 B1 | | 4/2003 | Tsuji |
| 6,559,836 B1 | | 5/2003 | Mori |
| 6,586,888 B2 | | 7/2003 | Kitahara et al. |
| 6,590,516 B2 | | 7/2003 | Inagaki et al. |
| 6,606,080 B2 | * | 8/2003 | Mukao ............ 345/98 |
| 6,633,284 B1 | | 10/2003 | Hanari |
| 6,693,385 B2 | | 2/2004 | Koyama |
| 6,714,091 B2 | | 3/2004 | Norskov et al. |
| 6,747,624 B1 | | 6/2004 | Udo et al. |
| 6,753,880 B2 | | 6/2004 | Kudo et al. |
| 6,756,951 B1 | | 6/2004 | Ishizuka et al. |
| 6,760,004 B2 | | 7/2004 | Koyama |
| 6,777,710 B2 | | 8/2004 | Koyama |
| 6,801,061 B2 | | 10/2004 | Cowles |
| 6,809,320 B2 | | 10/2004 | Iida et al. |
| 6,876,345 B2 | | 4/2005 | Akimoto et al. |
| 6,876,350 B2 | | 4/2005 | Koyama |
| 6,909,442 B2 | | 6/2005 | Hiyama et al. |
| 6,914,390 B2 | | 7/2005 | Koyama |
| 6,924,601 B2 | | 8/2005 | Date |
| 6,927,753 B2 | | 8/2005 | Koyama et al. |
| 6,952,194 B1 | | 10/2005 | Yamazaki et al. |
| 6,952,228 B2 | | 10/2005 | Yoneda et al. |
| 6,954,035 B2 | | 10/2005 | Chien et al. |
| 2001/0048408 A1 | | 12/2001 | Koyama et al. |
| 2002/0047581 A1 | | 4/2002 | Koyama |
| 2002/0135309 A1 | | 9/2002 | Okuda |
| 2002/0149608 A1 | | 10/2002 | Bu et al. |
| 2003/0048669 A1 | | 3/2003 | Abe |
| 2003/0128199 A1 | | 7/2003 | Kimura |
| 2003/0128200 A1 | | 7/2003 | Yumoto |
| 2003/0156012 A1 | | 8/2003 | Omidi et al. |
| 2004/0008074 A1 | | 1/2004 | Takehara et al. |
| 2004/0239599 A1 | | 12/2004 | Koyama |
| 2004/0239654 A1 | | 12/2004 | Okuda |
| 2005/0002260 A1 | | 1/2005 | Koyama |

FOREIGN PATENT DOCUMENTS

| | | |
|---|---|---|
| EP | 0 718 816 | 6/1996 |
| EP | 1063630 | 12/2000 |
| EP | 1102234 | 5/2001 |
| EP | 1 202 242 | 5/2002 |
| JP | 02-189579 | 7/1990 |
| JP | 05-042488 | 10/1993 |
| JP | 06-118913 | 4/1994 |
| JP | 07-036410 | 2/1995 |
| JP | 09-081087 | 3/1997 |
| JP | 09-134149 | 5/1997 |
| JP | 10-312173 | 11/1998 |
| JP | 11-109919 | 4/1999 |
| JP | 11-311970 | 11/1999 |
| JP | 11-344956 | 12/1999 |
| JP | 2001-034221 | 2/2001 |
| JP | 2001-042827 | 2/2001 |
| JP | 2001-042847 | 2/2001 |
| JP | 2001-056667 | 2/2001 |
| JP | 2001-147659 | 5/2001 |
| JP | 2001-242839 | 9/2001 |
| JP | 2002-221936 | 8/2002 |
| JP | 2002-251166 | 9/2002 |
| JP | 2003-066903 | 3/2003 |
| WO | WO03-034381 | 4/2003 |

OTHER PUBLICATIONS

S.O. Tan et al., "32.4 Designing of Circuit Building Blocks for OLED-on-Silicon Microdisplays", SID DIGEST 02; SID International Symposium Digest of Technical Papers, 2002; pp. 980-983.

K. Abe et al., "16-1: A Poly-Si TFT 6-bit Current Data Driver for Active Matrix Organic Light Emitting Diode Displays", Eurodisplay '02: Proceedings of the 22nd IDRC (International Display Research Conference), pp. 279-282; 2002.

R. Hattori, "Data-Line Driver Circuits for Current-Programmed Active-MatrixOLED Based on poly-Si TFTs", AM-LCD '02 Digest of Technical Papers, 2002. pp. 17-20.

R. Hattori et al., "Analog-Circuit Simulation of the Current-Programmed Active-Matrix Pixel Electrode Circuits Based on Poly-Si TFT for Organic Light-Emitting Displays",AM-LCD '01 Digest of Technical Papers, 2001, pp. 223-226.

A. Yumoto et al., "Pixel-Driving Methods for Large-Sized Poly-Si AM-OLED Displays", Asia Display / IDW '01, 2001, pp. 1395-1398.

R. Hattori et al., "Circuit Simulation of Poly-Si TFT Based Current-writing Active-Matrix Organic LED Display", Technical Report of IEICE, ED2001-8 SDM2001-8 vol. 101, No. 15, Apr. 2001, pp. 7-14.

* cited by examiner

FORMATION OF ISLAND-LIKE SEMICONDUCTOR LAYER AND GATE INSULATING FILM AND FIRST AND SECOND CONDUCTIVE FILM FOR GATE ELECTRODE

FIRST ETCHING PROCESSING AND FIRST DOPING PROCESSING

SECOND ETCHING PROCESSING

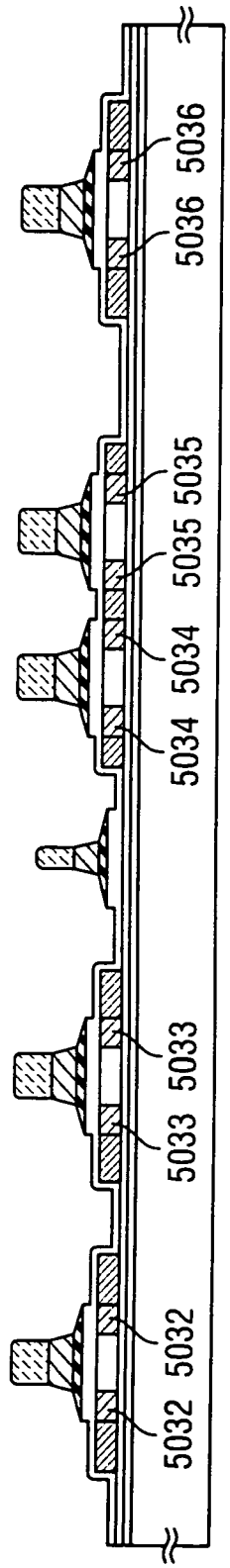
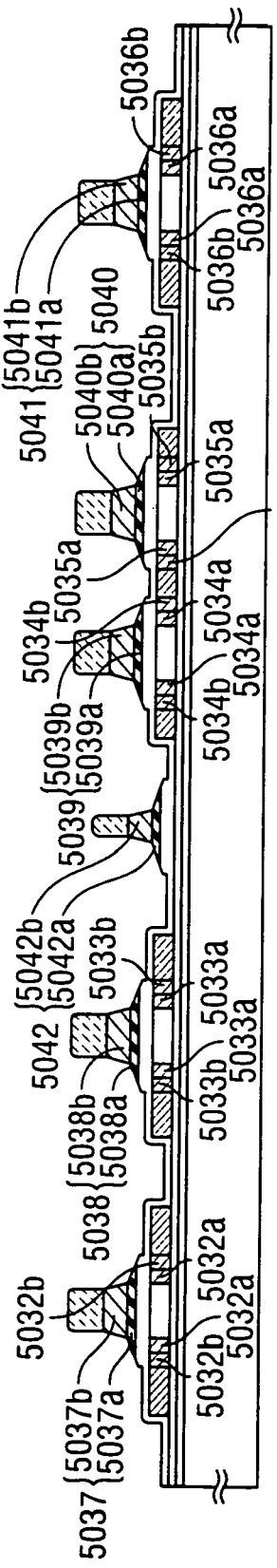
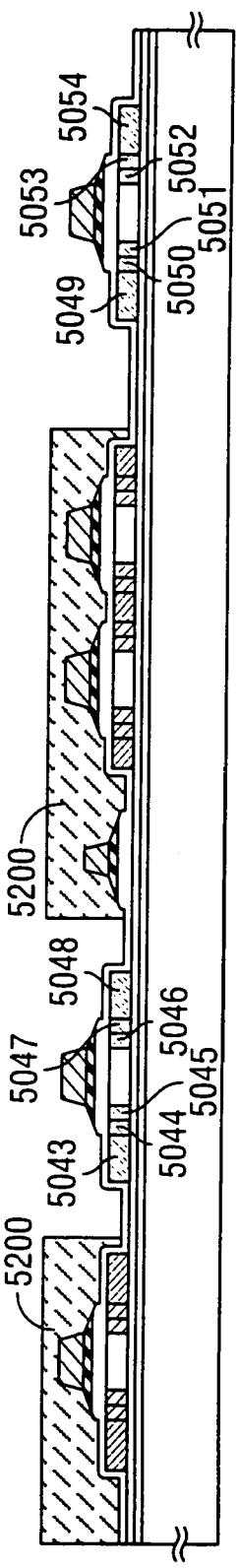

FORMATION OF FIRST AND SECOND INTERLAYER INSULATING FILMS AND WIRING AND PIXEL ELECTRODE

FORMATION OF THIRD INTERLAYER INSULATING FILM AND ORGANIC COMPOUND LAYER AND CATHODE ELECTRODE AND PASSIVATION FILM

ANALOG SWITCH

THIN FILM TRANSISTOR OF CURRENT SOURCE

DRIVE CIRCUIT, DISPLAY DEVICE USING THE DRIVE CIRCUIT AND ELECTRONIC APPARATUS USING THE DISPLAY DEVICE

CROSS-REFERENCE TO RELATED APPLICATIONS

This application is a continuation application of U.S. application Ser. No. 10/267,308, filed Oct. 8, 2002, now U.S. Pat. No. 6,777,885, which claims the benefit of a foreign priority application filed in Japan as Serial No. 2001-316116 on Oct. 12, 2001. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a driver circuit formed on an insulation surface. Further, it also relates to a display device having the driver circuit and a light emitting element provided on the insulation surface. Particularly, the present invention relates to an active matrix display having the driver circuit and a plurality of pixels which are arranged in matrix, and a switching element and a light emitting element are arranged in each pixel.

2. Description of the Related Art

An active matrix display device having a plurality of pixels in which a switching element and a light emitting element are arranged in each pixel, has advantages like superiority in response, operation with a low voltage and a wide view angle. Therefore, the active matrix display device comes under the spotlight as a next generation flat panel display.

Incidentally, the light emitting element means an element of which a luminance is controlled by electric current or voltage. For the light emitting element, electron source elements typified by an OLED (organic light emitting diode) element, a FE (field emission display) element, an MIM (Metal-Insulator-Metal) element and the like may be used.

The light emitting element comprises of an anode, a cathode, and a layer containing an organic compound (hereafter simply referred to as an organic compound layer) and sandwiched between the anode and the cathode. The light emitting element emits light according to a voltage applied between the anode and the cathode. Note that emitting the light emitting element is referred to as driving the light emitting element.

An organic compound layer usually has a lamination structure. A typical lamination structure thereof is one proposed by Tang et al. of Eastman Kodak Company and consisting of a hole-transporting layer, a light emitting layer, and an electron transporting layer. Other examples of the lamination structure include one in which a hole injection layer, a hole transporting layer, a light emitting layer, and an electron transporting layer are layered in order on an anode, and one in which a hole injection layer, a hole transporting layer, a light emitting layer, an electron transporting layer, and an electron injection layer are layered in order on an anode. A light emitting layer may be doped with a fluorescent pigment or the like. A given voltage is applied to the organic compound layer structured as above from a pair of electrodes (an anode and a cathode) to induce recombination of carriers in its light emitting layer. As a result, the light emitting layer emits light.

At this time, the emission luminance of the light emitting element is in proportion to the current flowing between the electrodes (the anode and the cathode). Accordingly, a pixel structure in which a current flowing to the light emitting element of each pixel is controlled by a current (hereafter referred to as control current) input to the pixel portion, is proposed. Such a pixel structure is referred as to current control type pixel.

An example of the structure of the current control type pixel in the active matrix display device is shown with FIG. 7.

As shown in FIG. 7, the current control type pixel comprises of a signal line 701, a scanning line 702, a power source line 703, a wiring 710, a light emitting element 709, a switching transistor 704, a current storage transistor 705, a current transistor 706 consisting of a current mirror circuit, a driver transistor 707 consisting of a current mirror circuit and using for driving the light emitting element, and a storage capacitor 708.

Either of a source electrode and a drain electrode of the switching transistor 704 is connected to the signal line 701, and the other is connected to a drain of the current transistor 706 and either of a source electrode and a drain electrode of the current storage transistor 705, further, the gate electrode of the switching transistor 704 is connected to the scanning line 702.

A source electrode of the current transistor 706 is connected to the power source line 703. A source electrode of the current storage transistor 705 or one side of a drain electrode of the current storage transistor 705 disconnected with the switching transistor 704 is connected to one of electrodes of the storage capacitor 708, a gate electrode of the current transistor 706 and a gate electrode of the driver transistor 707.

A side of the storage capacitor 708 disconnected with the current storage transistor 705 is connected to the power source line 703. A source electrode of the driver transistor 707 is connected to the power source line 703, while a drain electrode of the driver transistor 707 is connected to one of electrodes of the light emitting element 709.

Next, a driving method (operation method) in which a video signal is input to the pixel shown in FIG. 7 and the light emitting element emits light, will be described as below. Note that as the video signal input to the pixel, a current (signal current) having a current magnitude corresponding to the luminance represented by the pixel is input. In the pixel shown in FIG. 7, the control current which controls the current flowing to the light emitting element in each pixel is identical with the video signal (signal current).

A signal is input to the scanning line 702, thereby the switching transistor 704 is in state of ON, then, the signal current input from the signal line 701 is input to the pixel. At this time, the current storage transistor 705 is in state of conductive by the signal input to the wiring 710.

After the signal current is input to the pixel, as time sufficiently goes by, the signal current turns to flow between the source and the drain of the current transistor 706. At this time, in the storage capacitor 708, a gate voltage (a voltage between the gate and the source), in order that the current transistor 706 flows a signal current as a drain current, is retained. The signal of the wiring 710 changes thereafter, the current storage transistor 705 becomes in a non-conductive state.

In case that the characteristics of the current transistor 706 and driver transistor 707 are uniform, the drain current of the current transistor 706 is equal to the drain current of the driver transistor 707. At this time, a current equal to the signal current input from the power source line 703 thorough the driver transistor 707 is input to the light emitting element 709. After this manner, the light emitting element 709 emits light in a luminance corresponding to the signal current.

Note that even after the signal current is not input to the pixel, the driver transistor 707 flows a current equal to the signal current by the voltage retained in the storage capacitor 708.

FIG. 8 is a block diagram showing the configuration of an active matrix display device having the current control pixel illustrated in FIG. 7.

FIG. 8 illustrates a pixel portion 804, scanning driver circuits 803*a*, 803*b* which input signals to the scanning line of each pixel in the pixel portion 804, and a signal line driver circuit 802 which input signals to the signal line of each pixel in the pixel portion 804. The pixel portion. 804 and the scanning driver circuits 803*a*, 803*b* are provided on a substrate (hereafter referred to as pixel substrate) 801 having an insulation surface. The signal line driver circuit 802 which are out of a LSI chip 806 and the like, and the LSI chip 806 is attached to the pixel substrate 801 by a TAB 805.

Note that in the current control pixel shown in FIG. 7, the driver circuit input control current is denoted as a control current output circuit. In the configuration of the display device shown in FIG. 8, the control current output circuit corresponds to the signal line driver circuit.

Further, a wiring providing control current output from the control current output circuit to the pixel portion is denoted as a control current line. In the pixel portion shown in FIG. 7, the control current line corresponds to the signal line 701.

As shown in FIG. 8, the driver circuit (control current output circuit) inputting control current to the current control type pixel portion is formed from the LSI chip on a monocrystal substrate. The monocrystal substrate, in which the control current output driver circuit is formed, is attached to the pixel substrate by using the TAB and the like. In this way, the pixel portion can be electrically connected to the control current output circuit.

However, an area of overlap width is required when the control current output circuit is attached. Further, the wiring resistance and wiring capacitance between the control current output circuit and the pixel portion which are electrically connected with each other become large so that a low power consumption display device can't be realized.

Therefore, it is desirable to use a polycrystalline transistor to form the control current output circuit on the pixel substrate. Further, it becomes possible to set driver frequency highly by forming the control current output circuit with a polycrystalline transistor.

On the other hand, for the control current output circuit formed by using a polycrystalline, there is a problem with wide dispersion of output current due to influence of crystalline dispersion of channel formation region, etc. As described above, the light emitting element emits light in a luminance commensurate with the flowing current. Therefore, when dispersion exits among the pixels, a dispersion of luminance of light emitting element in pixel (hereafter also referred to as unevenness of display) is caused.

SUMMARY OF THE INVENTION

An object of the present invention is therefore to offer a control current output circuit formed by using a polysilicon transistor in which the dispersion of output current is suppressed.

Further, another object of the present invention is to offer an display device and electronic apparatuses applying the display device with capabilities of being miniaturized and consuming lower power by using the control current output circuit of the present invention.

The configuration of a driver circuit (control current output circuit) of the present invention will be described as below.

A control current output circuit has m (m represents a natural number) pieces of current output circuits (also referred to as current source circuit, hereafter referred to as quasi control current output circuit) outputting approximately the same value which corresponds a standard current input to the control current output circuit. These m pieces quasi control current output circuits have polysilicon transistor (to be specific, a TFT having polycrystalline semiconductor film, namely, polycrystalline TFT) therein, respectively.

In the present invention, an output current from m pieces quasi control current output circuits is averaged and output to n (n represents a natural number equal to m or less) pieces of output wirings (hereafter, referred to as output terminals).

For example, the output current from m pieces quasi control current output circuits is in turn switched and output to n pieces output terminals.

That is to say, a combination of connection of n pieces output terminals and output terminals which are connected to m pieces quasi control current output circuits is changed periodically.

In other words, during a set time period, a structure in which n pieces output terminals are connected one-to-one with respective output terminals of m pieces quasi control current output circuits respectively can be adopted.

Specifically, in a first output terminal and a second output terminal of n pieces output circuits and a control current output circuit having a first quasi control current output circuit and a second quasi control current output circuit, means of connection such as the first output terminal is connected to the output terminal of the first quasi control current output circuit; the second output terminal is connected to the output terminal of the second quasi control current output circuit; the first output terminal is connected to the output terminal of the second quasi control current output circuit; the second output terminal is connected to the output of the first quasi control current output circuit; can be selected.

In accordance with the above-described structure, the output current of the two quasi control current output circuits is output in a time-averaged state from the first and second output terminal.

In this manner, the output current output from the control current output circuit to n pieces control current line is time-averaged.

Accordingly, a driver circuit (control current output circuit) in which the dispersion of output current is suppressed can be offered. Further, in the display using the driver circuit (control current output circuit) of the present invention, the display dispersion of the pixel caused by the dispersion of the control current can be reduced visually.

Further, in the present invention, the control current output circuit formed by using polycrystalline TFTs on a substrate with an insulation surface can be formed on the same substrate where the pixel portion formed. Therefore, a display device with capabilities of being miniaturized and consuming lower power can be offered.

In addition, in the display device of the present invention, the signal line driver circuit can be comprised by a plurality of control current output circuits, the current value of the control current output from the plurality of control current output circuits may be different form each other. Further, the standard current which is input to the plurality of control current output circuits may be equal.

Note that although a plurality of pixels which consist of the display device in present invention have light emitting element, respectively, the light emitting element may be an OLED element, an element using an electron source element and the like.

Further note that the light emitting element may be an element using luminescence from singlet exciton (fluorescence) and an element using luminescence from triplet exciton (phosphorescence) in the present invention.

Moreover, any material which is out of a low molecular material, a high molecular material, and an intermediate molecular material can be a material for the organic compound layer of the light emitting element. Note that an intermediate molecular material in this specification denotes a material without sublimeness and the length of linked molecular is 10 μm or less. As the organic compound layer, a layer including lamination of an inorganic material layer and an organic material layer may be used. Specifically, such an inorganic material like silicon carbide and the like can be used as an electric charge transportation layer and an electric charge injection layer

BRIEF DESCRIPTION OF THE DRAWINGS

FIGS. 10A to 10C are diagrams showing the preparing steps of a display device of the present invention;

DESCRIPTION OF THE PREFERRED EMBODIMENTS

Embodiment 1

A control current output circuit and a display device using the control current output circuit of the present invention will be described below.

Figure 1:
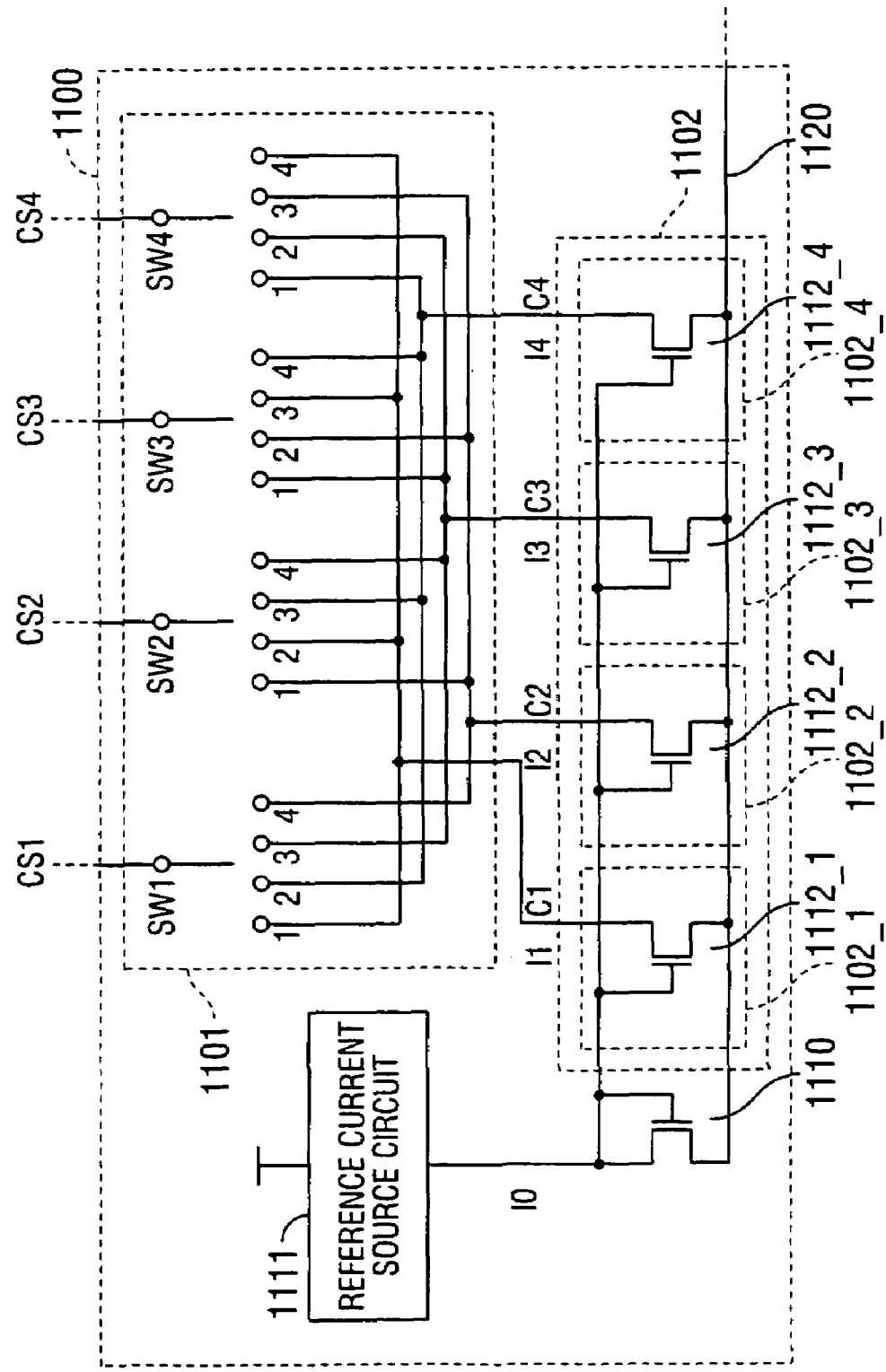
FIG. 1 is a diagram showing the configuration of a control current output circuit of the present invention.

FIG. 1 is a diagram showing the configuration example of a control current output circuit of the present invention. It should be noted that in the present Embodiment, a control current output circuit 1100 of the configuration in which output currents of 4 pieces of quasi control current output circuits 1102_1-1102_4 are in turn switched and outputted from 4 pieces of output terminals (output terminal section) of control current output circuits is exemplified.

In FIG. 1, the control current output circuit 1100 is composed of a switching circuit 1101 and the quasi control current output circuits 1102(1102_1-1102_4). The quasi current output circuits 1102_1-1102_4 has transistors 1112_1-1112_4, and output terminals C1-C4 of the quasi control current output circuits 1102_1-1102_4 correspond to drain terminals, respectively. Gate electrodes of the transistors 1112_1-1112_4 are connected to a gate electrode of a reference transistor 1110. The gate electrode and drain terminal (electrode) of a reference transistor 1110 are connected, a reference current I0 inputted from a reference current source circuit 1111 flows between the source/drain.

It should be noted that the potential of source terminal (electrode) of the reference transistor 1110 and the potentials of source terminals of transistors 1112_1-1112_4 are equally maintained. In the configuration shown in FIG. 1, the source terminal of the reference transistor 1110 and source terminals of transistors 1112_1-1112_4 are connected to the power supply line 1120, and the same potential is given.

In this way, the gate voltage of the reference transistor 1110 and the gate electrodes of the transistors 1112_1-1112_4 are equally maintained, and the transistors 1112_1-1112_4 draws the currents I1-I4 as drain currents, respectively. At this time, if the current characteristics of the transistors 1112_1-1112_4 are uniform, the current values of the currents I1-I4 are equal. But, since the transistors 1112_1-1112_4 are poly-crystal TFTs, actually, the currents I1-I4 are dispersed. Hence, the currents I1-I4 are switched through the switching circuit 1101 and outputted.

It should be noted that the current characteristics of the reference transistor 1110 and the current characteristics of the transistors 1112_1-1112_4 are not necessarily identical. This is to say, in the case where the same gate voltage is applied to the reference transistor 1110 and the transistor 1112 (indicating any of transistors 1112_1-1112_4), it is possible for a designer to set so that the flowing drain currents become the predetermined current ratio. However, it is desirable that the characteristics such as mobility, threshold voltage and the like are uniform.

For example, suppose that a gate length of the reference transistor 1110 is Lo and a gate width is Wo. Suppose that a gate length of the transistor 1112_1 is $L_1$, and a gate width is $W_1$. By making Lo/Wo: $L_1/W_1$ be 1:2, the current I1 can be made about ½ of the reference current I0.

Moreover, as for the reference transistor 1110 and the transistors 1102_1-1102_4 may be either of an n-channel type TFT or a p-channel type TFT, however, the polarities of the reference transistor 1110 and the transistors 1102_1-1102_4 have to be the same.

It should be noted that the control current output circuit of the present invention is not limited to this. The control current output circuit includes m (m represents a natural number) pieces of quasi current output circuits and n pieces of switching means for selecting one from the foregoing m pieces of quasi current output circuits (n represents a natural number of m or less), each of the foregoing n pieces of switching means may have a function for changing periodically the selection opponent of the foregoing m pieces of quasi current output circuits.

Next, the configuration of the switching circuit 1101 will be described below. The switching circuit 1101 is composed of switches SW1-SW4.

The switches SW1-SW4 in turn select terminals 1-4, respectively (however, actually, these are not terminals, but wires connected to the switches, which are selected). Here, in switches SWp (p represents a natural number of 1-4), in the case where terminal q (q represents a natural number of 1-4) is selected, in other switches except for switches SWp, the terminal q is selected.

Here, the terminals 1-4 are connected to the output terminals C1-C4 of the respective different quasi control current output circuits 1102_1-1102_4. Moreover, in the 4 sets of the terminals 1-4 corresponding to 4 lines of the control current lines CS1-CS4, the terminals which are denoted using the same reference characters and numerals are connected to the output terminals C1-C4 of the respective different quasi control current output circuits 1102_1-1102_4.

Figure 2:
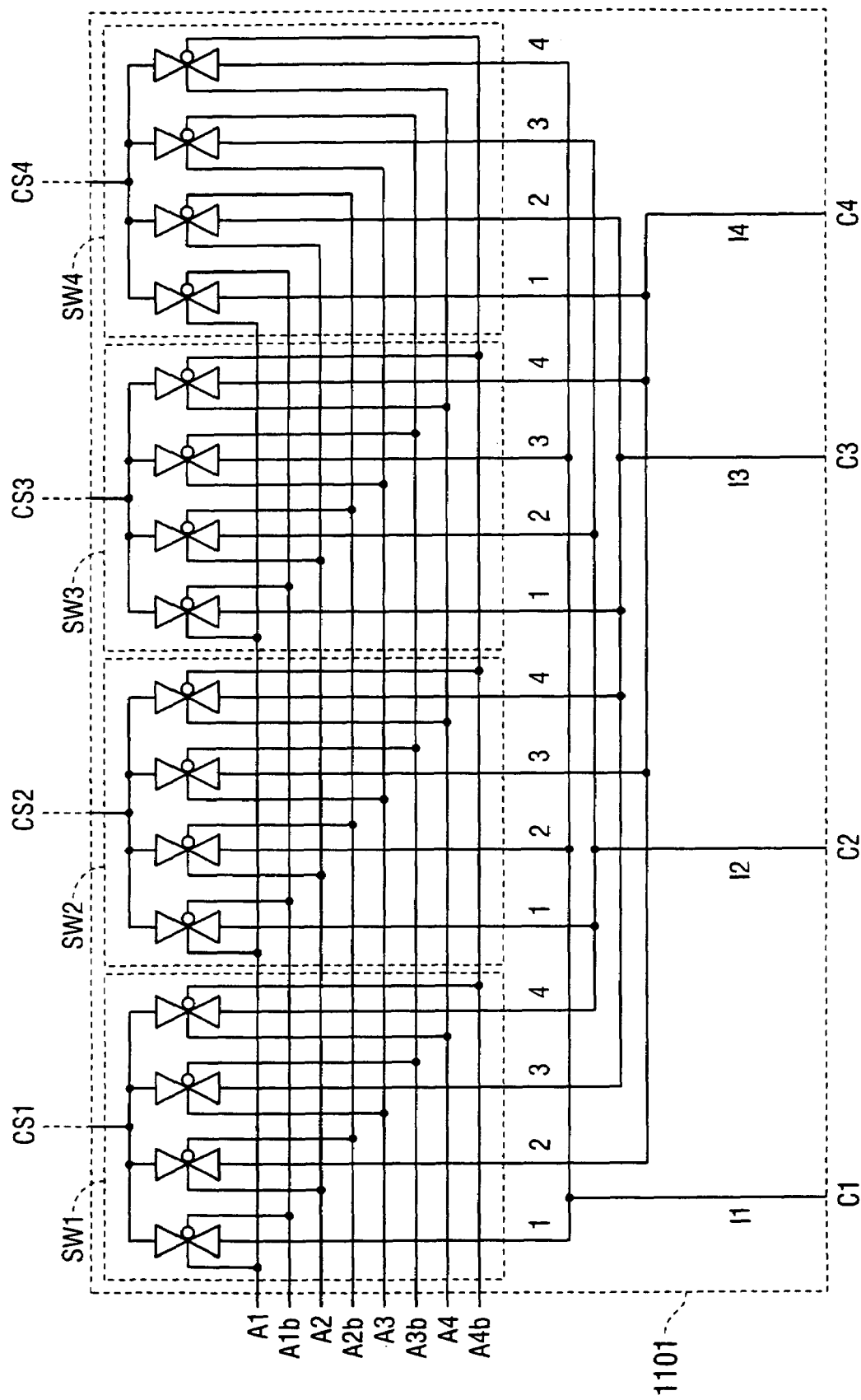
FIG. 2 is a diagram showing the configuration of a control current output circuit of the present invention.

Next, a concrete example of the configuration of circuits of Switches SW1-SW4 is shown in FIG. 2. It should be noted that in FIG. 2, the same portions as those of FIG. 1 are denoted using the same reference characters and numerals.

In FIG. 2, the switches SW1-SW4 are composed of 4 switches, respectively. The 4 switches in turn select the terminals 1-4 by the signals inputted in wirings A1-A4 and wirings A1b-A4b, and connected to the control current lines CS1-CS4.

It should be noted that the signal whose polarity of the signal inputted into a wirings Aq (q represents a natural number of 1-4) has been reversed is inputted into a wiring Aqb.

Figure 3:
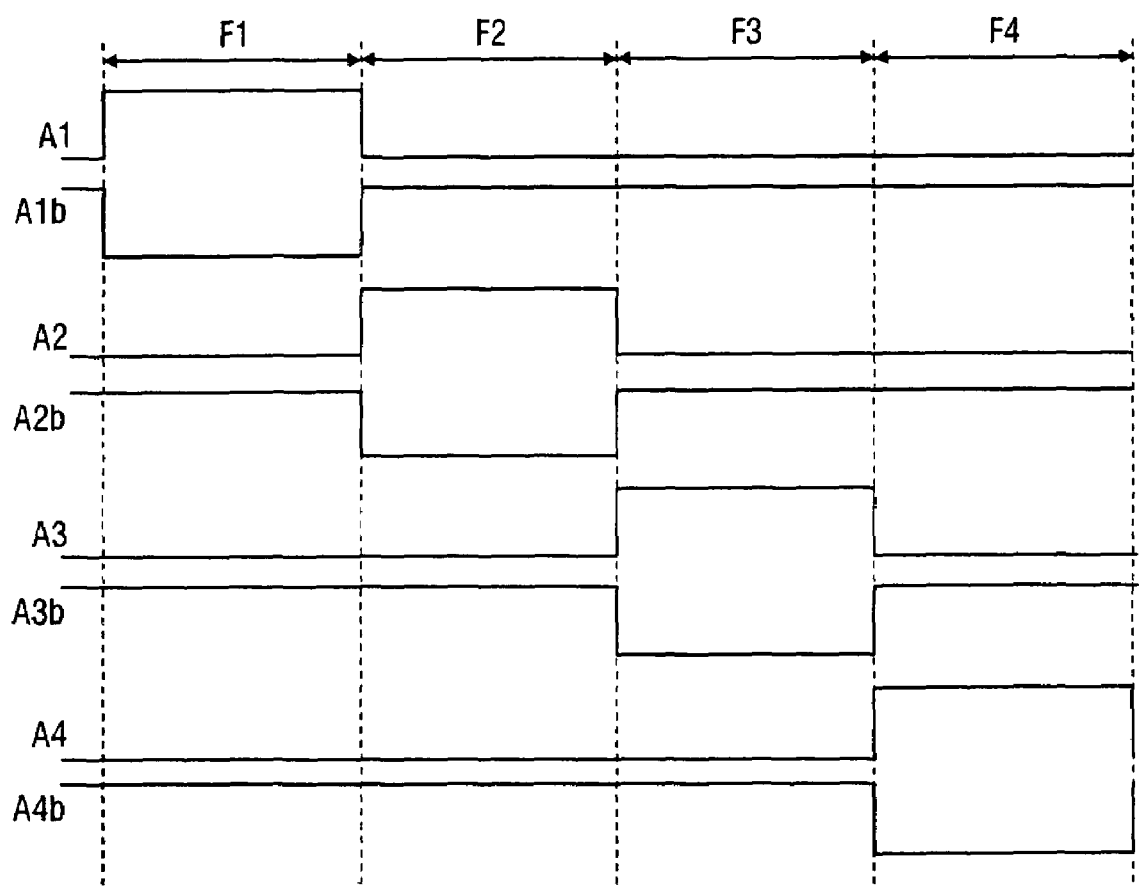
FIG. 3 is a diagram showing a timing chart showing a driving method of a control current output circuit of the present invention.

Next, the driving method of the control current output circuit of the configuration shown in FIG. 1 and FIG. 2 will be described below. In FIG. 3, a timing chart showing the driving method of the control current output circuit is shown.

A1-A4 and A1b-A4b shown in FIG. 3 indicate potentials of signals inputted into the wirings A-A4 and the wirings A1b-A4b. Moreover, frame time periods F1-F4 in turn indicate one frame time period. It should be noted that one frame time period is referred to a time period during which a display device displays one image. Usually, one frame time period is set about ⅟60 second so that it does not dazzle human eyes.

In the first frame time period F1, a signal is inputted into the wiring A1 and the wiring A1b, respectively and the terminal 1 is selected in SW1-SW4, respectively.

In the second frame time period F2, a signal is inputted into the wiring A2 and the wiring A2b, and in SW1-SW4, the terminal 2 is selected, respectively.

A similar operation is repeated, and the frame time period F1-the frame time period F4 are terminated. In this way, SW1-SW4 in turn select the terminal 1-the terminal 4, respectively.

In this way, as described above, by operating the switching circuit 1101, the mean temporal values of current values of output currents of the control current lines CS1-CS4 become the same.

In this way, the currents outputted into the control current lines CS1-CS4 are time averaged and outputted. Hence, by utilizing the control current output circuit 1100 of the above-described configuration for a display device, the irregularity of the display of the pixels due to the dispersion of control currents can be visually reduced.

It should be noted that the timing chart shown in FIG. 3, it has been configured that the respective switches SW1-SW4 are in turn switched per each one frame time period and the terminal 1-the terminal 4 are in turn selected. In the above-described driving method, a certain switch SWq (q represents a natural number of 1-4), the time period during which the terminal 1 is selected, the time period during which the terminal 2 is selected, the time period during which the terminal 3 is selected and the time period during which the terminal 4 is selected are set in the same length.

However, the present invention is not limited to this. It can be configured so that switches SW1-SW4 are switched per each given length. For example, it is capable of being also configured that the respective switches SW1-SW4 are switched per 2 frame time periods, respectively, and the terminal 1-the terminal 4 are in turn selected.

It should be noted that in FIG. 1 and FIG. 2, only the control current output circuits corresponding to 4 lines of control current lines are representatively shown. But in the actual display device, it may be configured that all of the control current lines from which control current is inputted to each pixel are divided into a plurality of sets, in the respective sets and the control current is outputted from the control current output circuit of the configuration similar to that of FIG. 1.

Figure 15A:
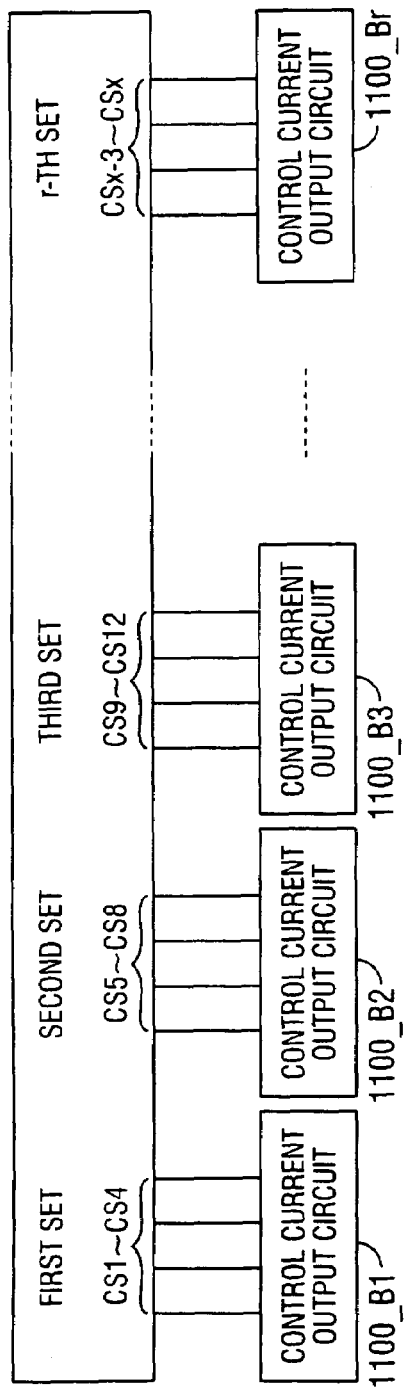
FIGS. 15A and 15B are diagrams showing the configuration of a control current output circuit of the present invention.

In FIG. 15A, the configuration is shown in which all of the control current lines CS1-CSx for outputting control current to each pixel of the display device are divided into a plurality of sets (the first set—the r th (r represents a natural number) set), in the respective sets, the control current output circuits 1100_B1-1100_Br which is configured similar to the control current output circuit 1100 shown in FIG. 1 are disposed.

It should be noted that since the respective configurations and driving methods of the control current output circuits 1100_B1-1100_Br are similar to the configurations shown in FIG. 1 and FIG. 2 and the driving method shown in FIG. 3, here the description about them is omitted.

In the configuration of FIG. 15A, in the control current output circuits 1100_B1-1100_Br corresponding to a plurality of sets of control current lines, respectively, it may be configured so that the reference current I0 is inputted from the common reference current source circuit. Furthermore, in the control current output circuits 1100_B1-1100_Br, it may be configured so that the reference transistor is commonly shared.

Figure 15B:
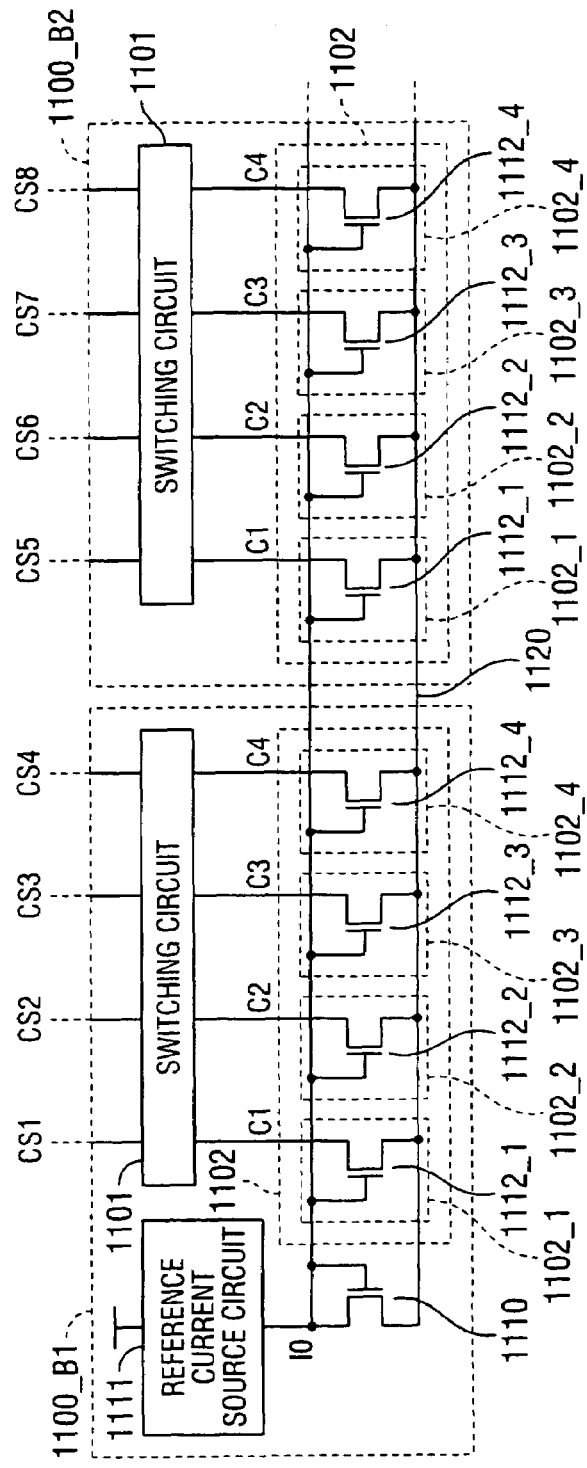

In the configuration shown in FIG. 15A, the configuration having the common reference current source circuit 1111 and the reference transistor 1110 in the control current output circuits 1100_B1-1100_Br is shown and FIG. 15B.

It should be noted that in the control current output circuits 1100_B1-1100_Br, the same portions as those of FIG. 1 are denoted using the same reference characters and numerals.

In FIG. 15B, as for transistors 1112_1-1112_4 of the quasi control current output circuits 1102_1-1102_4 configuring the control current output circuit 1100_B1 and transistors 1112_1-1112_4 of the quasi control current output circuit 1102_1 1102_4 configuring the control current output circuit 1100_B2, their source terminals are connected to the electrical source line 1120, and their gate electrodes are connected to a gate electrode of the reference transistor 1110.

It should be noted that in FIG. 15B, although the control current output circuit 1100_B1 corresponding to the first set of control current lines CS1-CS4 and the control current output circuit 1100_B2 corresponding to the second set of the control current lines CS5-CS8 are representatively shown, as for transistors 1112_1-1112_4 configuring the quasi control current output circuits 1102_1-1102_4 of all of the control current output circuits 1100_B1-1100_Br, their source terminals are connected to the power supply line 1120, and their gate electrodes are connected to a gate electrode of the reference transistor 1110.

In this way, the voltage equal to a gate voltage of the common reference transistor 1110 is applied as a gate voltage of the transistors 1112_1-1112_4 configuring the quasi control current output circuits 1102_1-1102_4 of all of the control current output circuits 1100_B1-1100_Br.

It should be noted that in the control current output circuits 1100_B1-1100_Br, driving timing of the switching circuit 1101 can be made equal. That is, it can be made that the timings at which the switches SW1-SW4 configuring the switch circuit 1101 shown in FIG. 1 select the terminal 1-the terminal 4 are made equal in all of the switching circuits 1101 of the control current output circuits 1100_B1-1100_Br.

For example, an example in which the configuration similar to that of FIG. 2 is used as a configuration of the switching circuit 1101 is exemplified. At this time, it is made so that the wirings A1-A4 and the wirings A1b-A4b of the switching circuit 1101 are shared in all of the switching circuit 1101 of the control current output circuits 1100_B1-1100_Br.

In this way, as shown in FIG. 3, a signal is inputted into the wirings A1-A4 and the wirings A1b-A4b, the timings at which the switches SW1-SW4 configuring the switching circuit 1101 select the terminal 1-the terminal 4 are made equal in all of the switching circuits 1101 of the control current output circuits 1100_B1-1100_Br.

In the above-described configurations, the control current time averaged can be outputted to all of the control current lines CS1-CSx formed on the pixel section of the display device. In this way, the visual dispersion of the brightness for luminous elements of the respective pixels that the display device has can be reduced.

Embodiment 2

In the present Embodiment, the configuration of a control current output circuit different from the configuration shown in Embodiment 1 will be described below with reference to FIG. 14.

Figure 14:
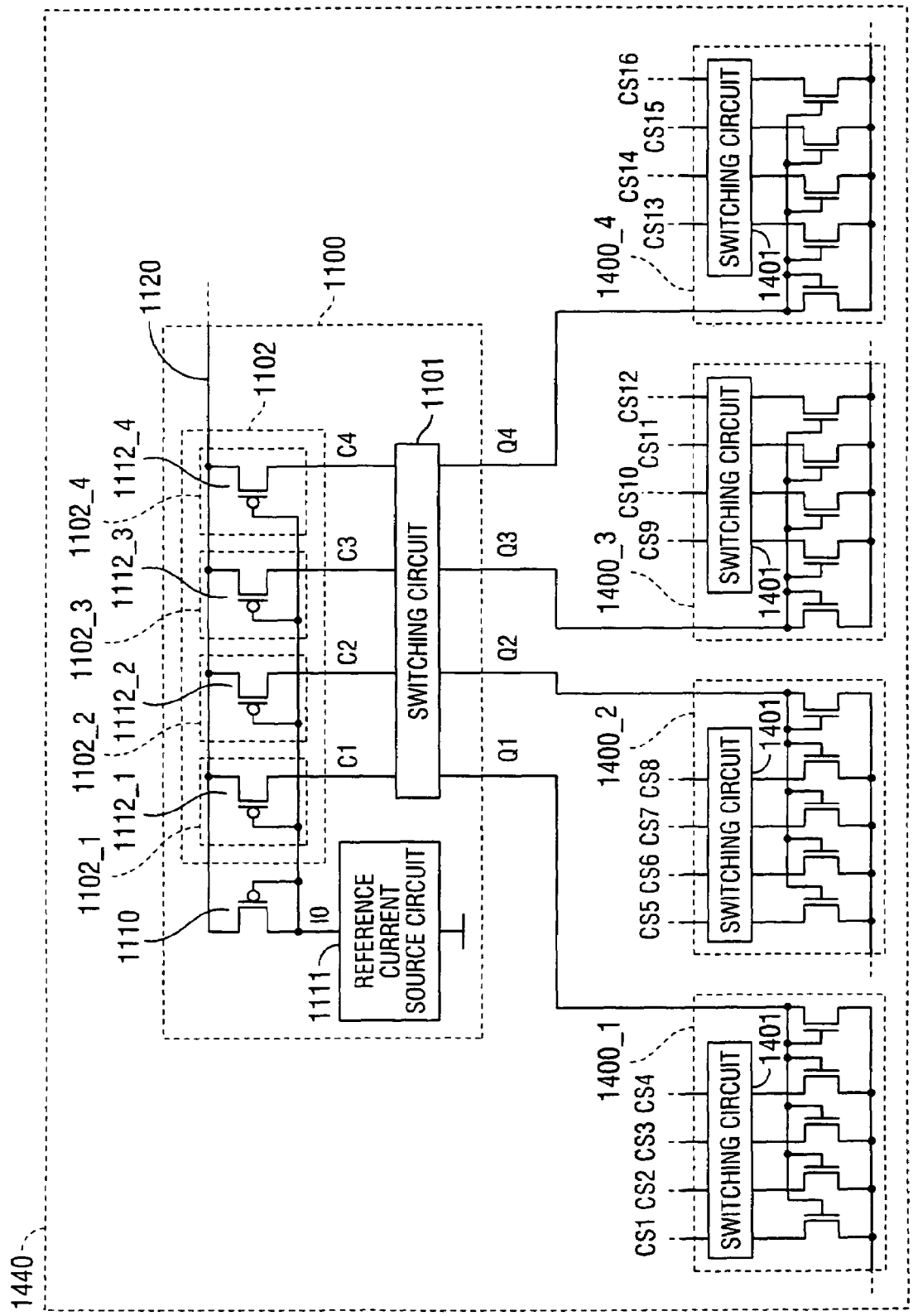
FIG. 14 is a diagram showing the configuration of a control current output circuit of the present invention.

In FIG. 14, a control current output circuit 1440 of the present Embodiment has a control current output circuit 1100, an output current outputted from the output terminals Q1-Q4 of the control current output circuit 1100 is characterized in that it is inputted into 4 of control current output circuits 1400_1-1400_4 as the reference current. Then, the control current is outputted to the control current lines CS1-CS16 from the control current output circuits 1400_1-1400_4.

In this way, the dispersion of the output currents can be further reduced by switching the reference current and supplying it to the control current output circuits 1400_1-1400_4.

It should be noted that the configurations and the driving method of the control current output circuit 1100 and the control current output circuits 1400_1-1400_4 can be made similar to the configurations shown in FIG. 1 and FIG. 2 and the driving methods shown in FIG. 3 in Embodiment 1.

It should be noted that in FIG. 14, it has been configured so that as for the control current output circuit 1100, output currents of 4 pieces of the quasi control current output circuits 1102-1-1102_4 are in turn exchanged periodically by the switching circuit 1101, outputted from 4 pieces of output terminals Q1-Q4, but the present invention is not limited to this.

The control current output circuit 1100 in FIG. 14 includes m pieces (m represents a natural number) of quasi current output circuits and n pieces (n represents a natural number of m or less) of switching means for selecting one from the foregoing m pieces of quasi current output circuits, each of the foregoing n pieces of switching means may have a function for changing periodically the selection opponent of the foregoing m pieces quasi current output circuits.

Moreover, in FIG. 14, it has been configured that as for the respective control current output circuit 1400_1-1400_4, output currents of 4 pieces of quasi control current output circuits are in turn exchanged periodically by the switching circuit 1401 and outputted to 4 lines of control current lines from 4 pieces of output terminals, but the present invention is not limited to this.

The control current output circuits 1400_1-1400_4 in FIG. 14 includes f pieces (f represents a natural number) of quasi current output circuits and e pieces (e represents a natural number of f or less) of switching means for selecting one from the foregoing f pieces of quasi current output circuits, each of the foregoing e pieces of switching means may have a function for changing periodically the selection opponent of the foregoing f pieces quasi current output circuits.

It should be noted that in FIG. 14, only the control current output circuit 1440 corresponding to 16 lines of control current lines CS1-CS16 has been described. However, in the actual display device, it may be configured so that all of the control current lines for inputting the control current to each pixel are divided into a plurality of sets and the control current is outputted per set from the control current input circuit 1440 of the configuration similar to that of FIG. 14.

Figure 16A:
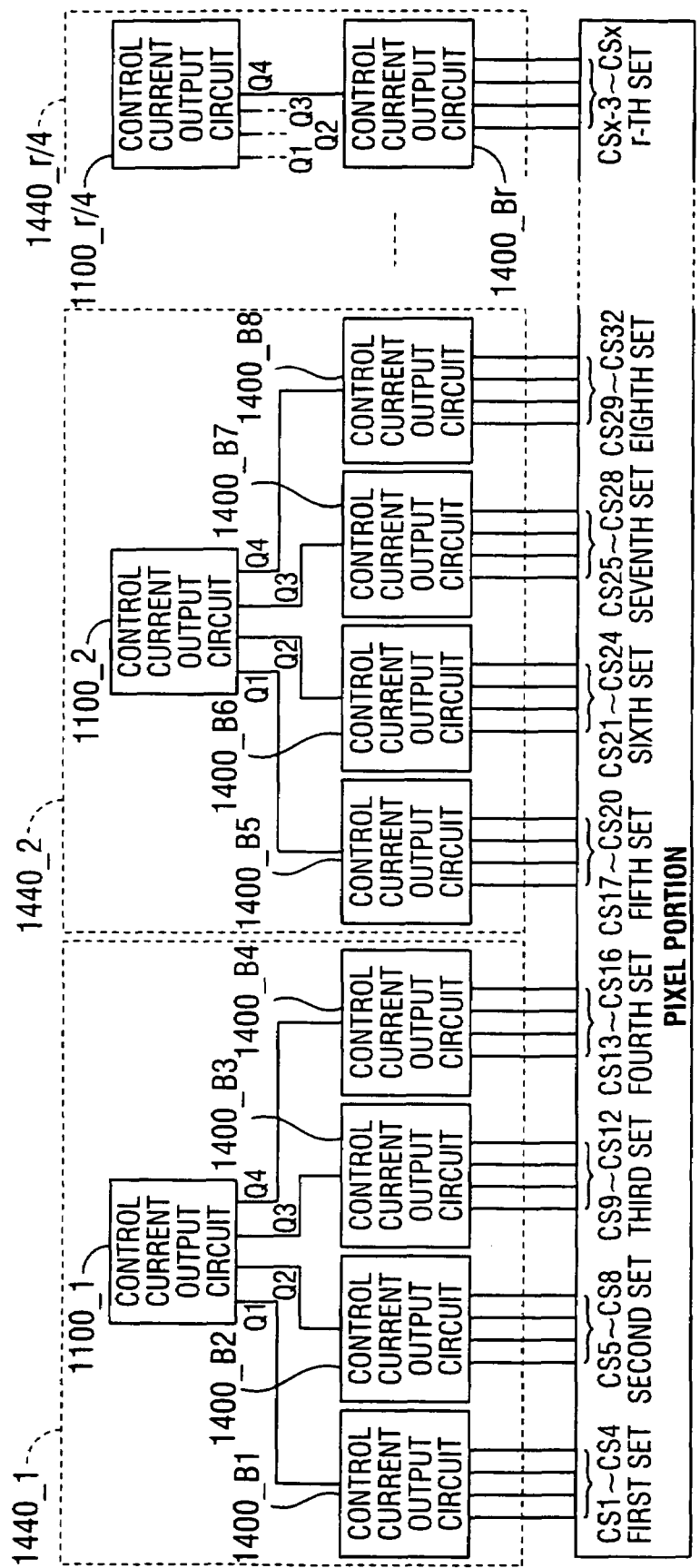
FIGS. 16A and 16B are diagrams showing the configuration of a control current output circuit of the present invention.

In FIG. 16A, the configuration in which all of the control current lines CS1-CSx for inputting the control current to each pixel of the display device are divided into a plurality of sets (the first set—the r th (r represents a natural number) set) and the control current output circuits 1440_1-1440_r/4 of the configuration similar to the control current output circuit 1440 shown in FIG. 16 are disposed is shown.

The respective configurations of the control current output circuits 1440_1-1440_r/4 are similar to the configurations of the control current output circuit 1440 shown in FIG. 14. For example, in FIG. 16 A, the control current output circuits 1400_B1-1400_B4 of each control current output circuit 1400_1 correspond to the control current output circuits 1400_1-1400_4 in FIG. 14, and the control current output circuit 110_1 corresponds to the control current output circuit 1100 in FIG. 14.

In the configuration of FIG. 16A, it may be configured so that the reference current I0 is inputted from the common reference current source circuit in the control current output circuits 1440_1-1440_r/4 corresponding to a plurality of sets of control current lines, respectively.

Furthermore, it may be configured so that in the control current output circuits 1440_1-1440_r/4, the reference transistor is shared.

Figure 16B:
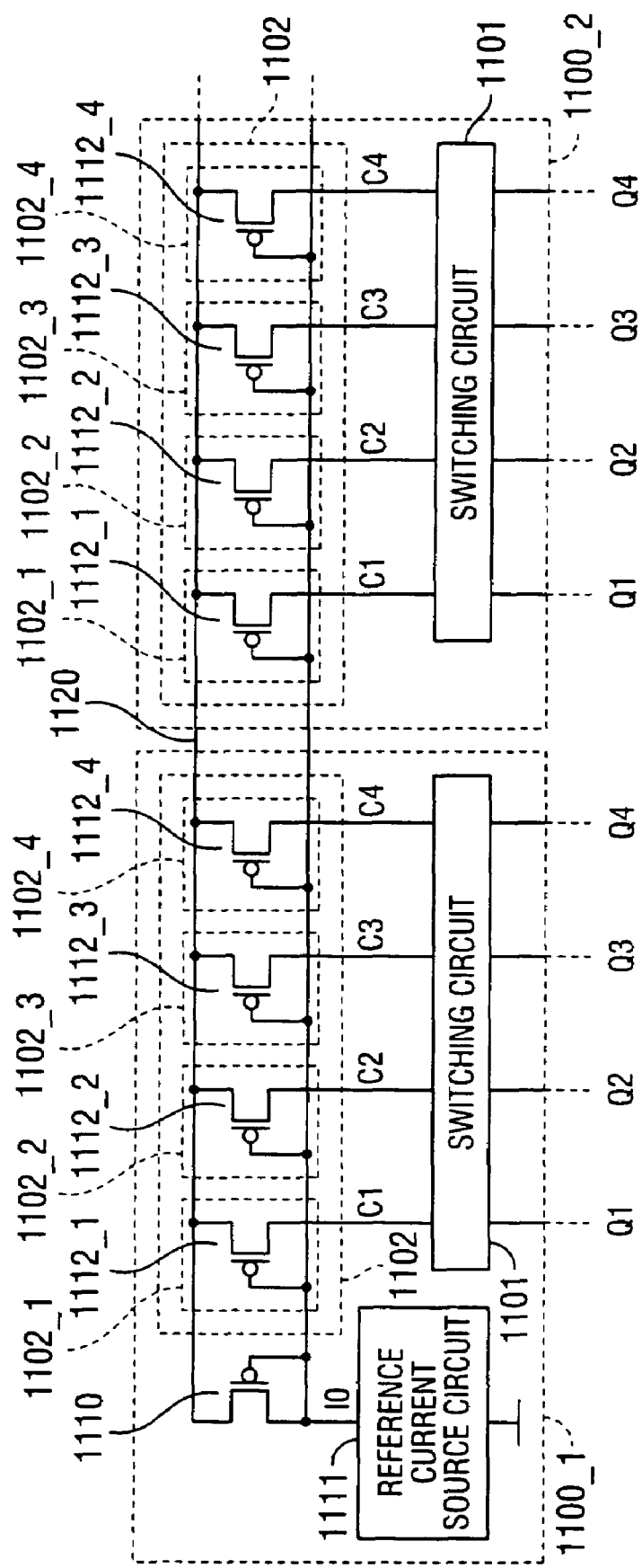

In FIG. 16B, the configuration in which it has a common reference current source circuit 1111 and the reference transistor 1110 in the control current output circuits 1440_1-1440_r/4 in the configuration shown in FIG. 16A is shown. It should be noted that in the control current output circuits 1100_1-1100_2 in the control current output circuits 1440_1-1440 r/4, the same portions as those of FIG. 14 are indicated using the same reference characters and numerals.

In FIG. 16B, as for the transistors 1112_1-1112_4 of the quasi control current output circuits 1102_1-1102_4 configuring the control current output circuit 1100_1 and the transistors 1112_1-1112_4 of the quasi control current output circuit 1102_1-1102_4 configuring the control current output circuit 1100_2, their source terminals are connected to the power supply line 1120, and their gate electrodes are connected to the gate electrode of the reference transistor 1110.

It should be noted that in FIG. 16B, although the control current output circuit 1440_1 corresponding to the first set-the fourth set of control current lines CS1-CS16 and the control current output circuit 1440_2 corresponding to the fifth set-the eighth set of the control current lines CS17-CS32 have been representatively shown. However, as for transistors 1112_1-1112_4 configuring the quasi control current output circuits 1102_1-1102_4 of the control current output circuits 1100_1-1100_r/4 of all of the control current output circuits 1440_1-1440_r/4, their source terminals are connected to the power supply line 1120, and their gate electrodes are connected to the gate electrode of the reference transistor 1110.

In this way, the voltage equal to a gate voltage of the common reference transistor 1110 is applied as gate voltages of the transistors 1112_1-1112_4 configuring the quasi control current output circuits 1102_1-1102_4 of the control current output circuits 1100_1-1100_r/4 of all the control current output circuits 1440_1-1440_r/4.

It should be noted that in the control current output circuits 1100_1-1100_r/4, the driving timings of the switching circuit 1101 can be made equal. That is, it can be made that the timings at which the switches SW1-SW4 configuring the switch circuit 1101 shown in FIG. 1 select the terminal 1-the terminal 4 are made equal in all the switching circuits 1101 of the control current output circuits 1100_1-1100_r/4.

For example, as a configuration of the switching circuit 1101, an example in which the configuration similar to that of FIG. 2 is used is exemplified. At this time, it is made that the wirings A1-A4 and the wirings A1b-A4b of the switching circuit 1101 are shared in all of the switching circuit 1101 of the control current output circuits 1100_1-1100_r/4.

In this way, as shown in FIG. 3, it is made that a signal is inputted into the wirings A1-A4 and the wirings A1b-A4b, the timings at which the switches SW1-SW4 configuring the switching circuit 1101 select the terminal 1-the terminal 4 are made equal in all of the switching circuit 1101 of the control current output circuits 1100_1-1100_r/4.

It should be noted that the driving timing of the switching circuit 1101 of the control current output circuits 1100_1-1100_r/4 and the driving timing of the switching circuit 1401 of the control current output circuits 1400_B1 1400_Br are capable of being carried out in separate timings.

In the above-described configuration, the control current time averaged can be outputted to all of the control current lines CS1-CSx formed on the pixel section of the display device. In this way, the visual dispersion of the brightness for luminous element{s} of the respective pixels that the display device has can be reduced.

Here, in the configuration shown in FIG. 15B in Embodiment 1, the dispersion of output current between the control current output circuits corresponding to the different sets of control current lines has not become a problem.

On the other hand, in the present Embodiment, as shown in FIG. 14, it is configured so that output current from one of output terminals of the control current output circuit 1100 for outputting the current which is less dispersed and temporarily averaged to a plurality of control current lines using the control current output circuits 1400_1-1400_4 or the like. At this time, the control current output circuits 1400_1-1400_4 output the currents which have been temporarily averaged and less dispersed as a control current.

Therefore, if the configuration of the present Embodiment 2 is used, the dispersion of output currents to different sets of the control current lines, corresponding to the control current output circuit 1440-1-1440-r/4 respectively, can be reduced.

In the present Embodiment, as shown in FIG. 14, by combining a plurality of control current output circuits of the present invention, the control current output circuit whose dispersion of the current to be outputted has been further reduced can be obtained.

EXAMPLES

Example 1

In the present Example, an example of a display device which has a plurality of control current output circuits and in which the control current values that the respective control current output circuits output are set in different ways will be described below.

It should be noted that in the present Example, a display device which inputs a digital video signal, inputs an analog current corresponding to the inputted digital video single into a pixel as a control current, and performs the image display will be exemplified and described below.

Here, control currents that a plurality of control current output circuits output respectively correspond to the tone reference currents. It should be noted that the tone reference current is referred to a current having a current value which is weighted corresponding to the respective bits of higher order bit-lower order bit of the digital video signal.

The corresponding tone reference current is selected by a digital video signal. In this way, the digital video signal is converted into the corresponding analog current. Then, the analog current is outputted into the control current line.

That is, a plurality of control current output circuits shown in the present Example function as one portion of the signal line drive circuits for inputting the signal current into pixels.

Figure 4:
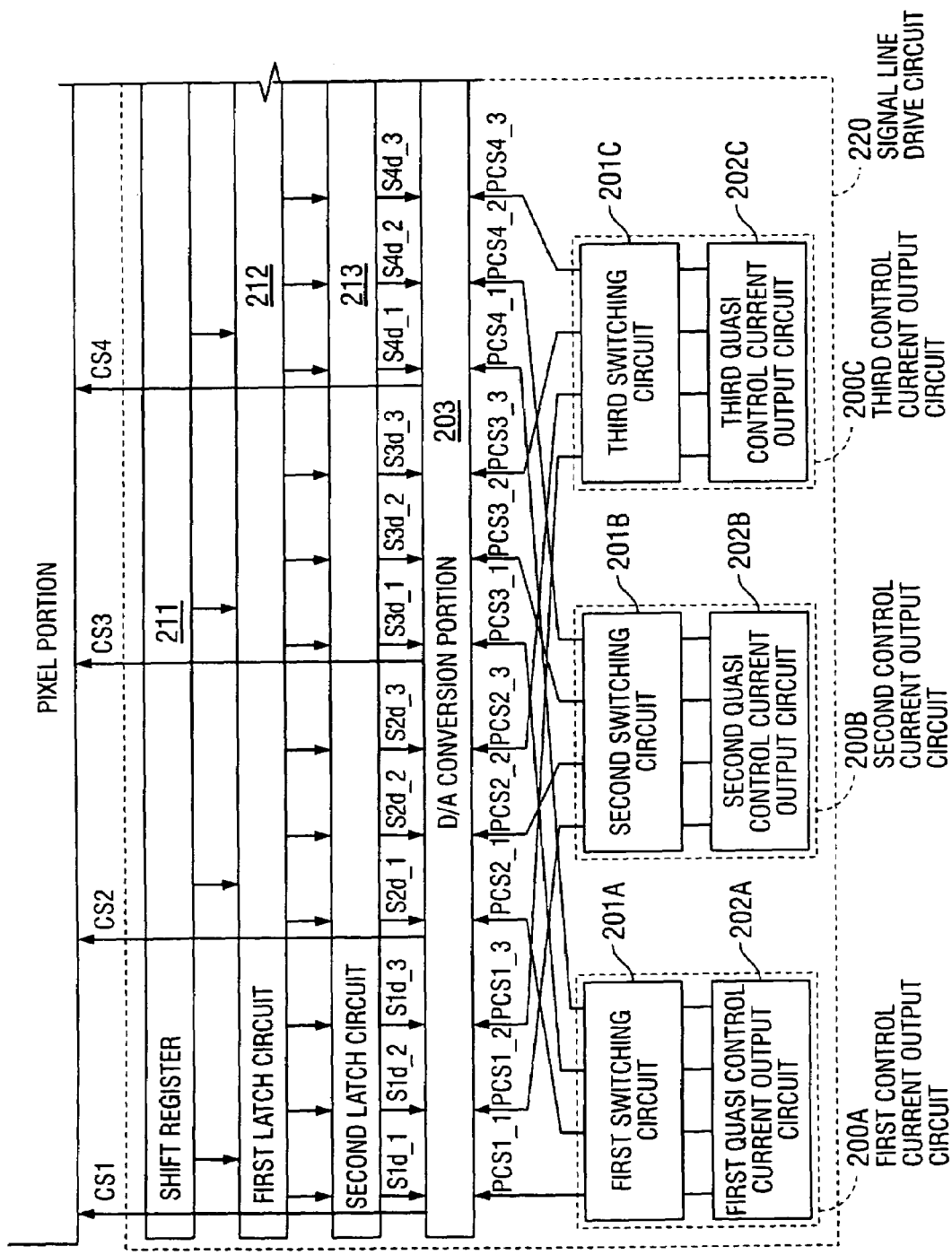
FIG. 4 is a schematic diagram showing the configuration of a control current output circuit of the present invention.

In FIG. 4, a schematic diagram showing the configuration of a signal line drive circuit 220 that a display device of the present invention has is shown.

In FIG. 4, an example in which a 3-bit digital video signal is inputted and an analog current corresponding to this is outputted as a control current will be exemplified below.

The signal line drive circuit 220 has a first control current output circuit 200A, a second control current output circuit 200B, a third control current output circuit 200C, a D/A conversion portion 203, a shift register 211, a first latch circuit 212 and a second latch circuit 213.

The first control current output circuit 200A has a first quasi control current output circuit 202A consisted of 4 pieces of the quasi control current output circuits and a first switching circuit 201A.

The second control current output circuit 200B has a second quasi control current output circuit 202B consisted of 4 pieces of the quasi control current output circuits and a second switching circuit 201B.

The third control current output circuit 200C has a third quasi control current output circuit 202C consisted of 4 pieces of the quasi control current output circuits and a third switching circuit 201C.

In FIG. 4, the configuration of the respective control current output circuits (the first control current output circuit 200A, the second control current output circuit 200B, and the third control current output circuit 200C) is nearly similar to the configuration shown in Embodiment.

However, the current value of the current that the first control current output circuit 200A outputs (hereinafter, referred to the first tone reference current) is set at the weighted current value corresponding to the first order bit of the digital video signal which is inputted into the display device. Moreover, the current value of the current (hereinafter, referred to the second tone reference current) that the second current output circuit 200B outputs is set at the weighted current value corresponding to the second order bit of the digital video signal which is inputted into the display device. Then, the current value of the current (hereinafter, referred to the third tone reference current) that the third control current output circuit 200C outputs is set at the weighted current vale corresponding to the third order bit of the digital video signal which is inputted into the display device.

Moreover, in the present Example, an example in which in the respective circuits of the first control current output circuit 200A—the third control current output circuit 200C, 4 output currents of the quasi control current output circuits are in turn exchanged and outputted into 4 pieces of the output terminals of the control current output circuits will be exemplified below.

It should be noted that a control current output circuit of the present invention is not limited to this. A control current output circuit of the present invention includes m (m represents a natural number) pieces of quasi current output circuits and n (n represents a natural number of m or less) pieces of switching means for selecting one from the foregoing m pieces of quasi current output circuits, the respective the foregoing n pieces of switching means may have a function for changing periodically the selection opponent of the foregoing m pieces of quasi current output circuits.

In the present Example, the respective output currents of the first control current output circuit 200A—the third control current output circuit 200C are inputted into D/A conversion section 203, respectively.

Moreover, a 3-bit digital video signal is inputted from the wirings VD1-VD3 into the signal line drive circuit 220. Here, suppose that the first order (the most significant) bit signal of the digital video signal is inputted the wiring VD1. Suppose that the second order bit signal of the digital video signal is inputted into the wiring VD2. Then, the third order (the least significant) bit signal of the digital video signal is inputted into the wiring VD3.

An operation for sampling a 3-bit digital video signal inputted into the signal line drive circuit 220 will be described in detail below.

It should be noted that in the present Example, suppose that the display device has pixels of x (x represents a natural number) columns.

Figure 6:
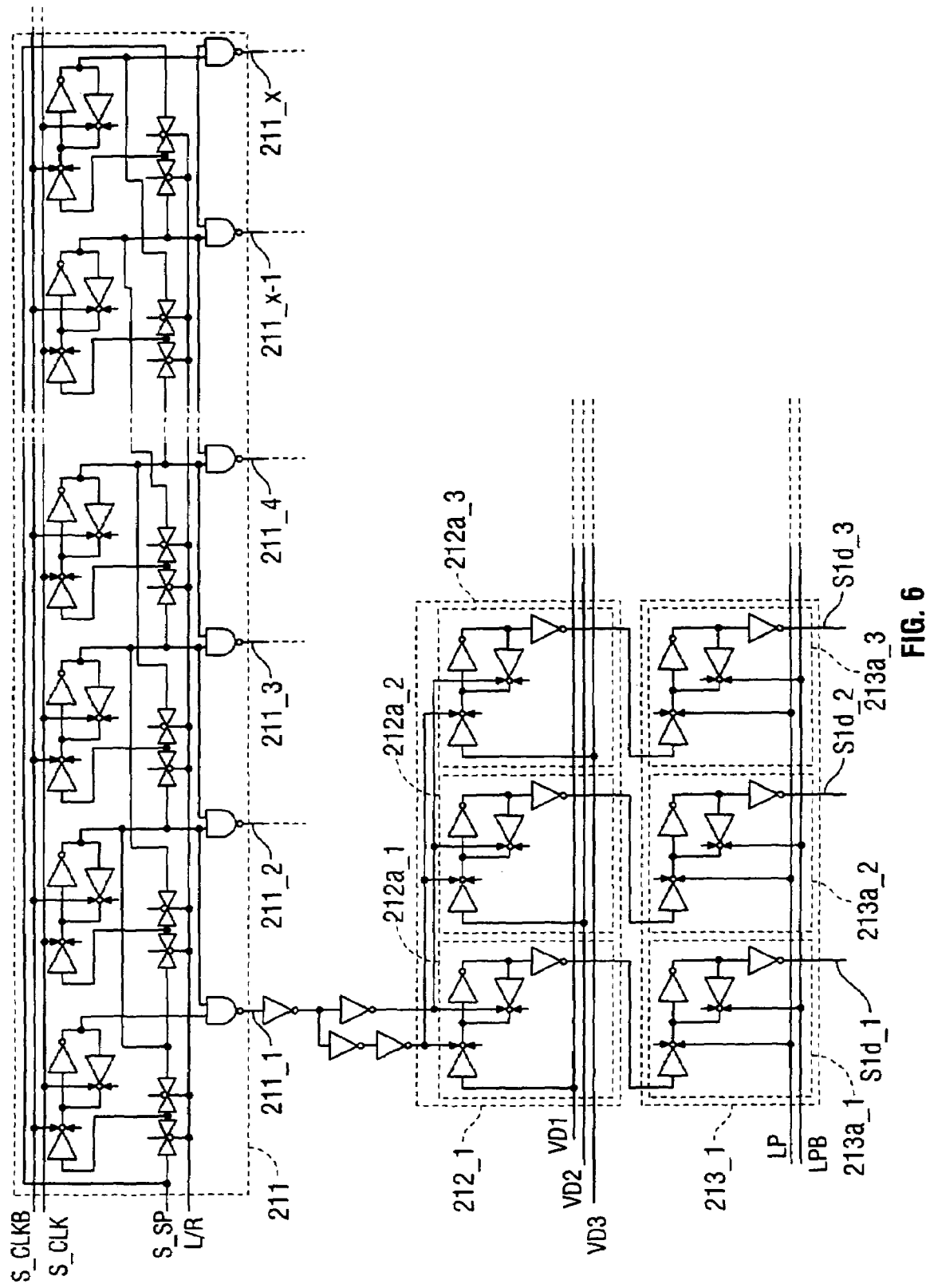
FIG. 6 is a diagram showing the configuration of a control current output circuit of the present invention.

In FIG. 6, a configuration example in which the shift resistor 211, the first latch circuit 212 and the second latch circuit 213 have been disposed in FIG. 4 is shown.

A clock pulse S_CLK, a reverse clock pulse S_CLKB that the polarity of the clock pulse is reversed and a start pulse S_SP and a scanning direction switching signal L/R are inputted into the shift resistor 211. In this way, the shift resistor in turn out puts the shifted pulse (sampling pulse) into the terminals 211_1-211_x.

In FIG. 6, only one portion of 212_1 of the first latch circuit and one portion 213_1 of the second latch circuit corresponding to the portion which outputs the first pixel column are representatively shown.

The digital video signals inputted into the wirings VD1-VD3 are retained in the respective blocks 212a_1-212a_3 of the first latch circuit 212_1 simultaneously by sampling pulse outputted from the shift register 211 into 211_1. When the first latch circuit has finished retaining 3-bit digital video signals of one pixel row portion, the retained signals are all at once transferred to the respective blocks 213a_1-213a_3 of the second latch circuit 213_1 by the reverse latch pulse LPB that the polarity of the latch pulse LP and the latch pulse has been reversed. The signals retained in the respective blocks 213a_1-213a_3 of the second latch circuit 213_1 are outputted into wiring S1d_1-wiring S1d_3.

In this way, the second latch circuit 213 all at once outputs 3-bit digital video signals corresponding to the respective pixels of one pixel row.

The output of the second latch circuit 213 is inputted into the D/A conversion section 203.

Again, FIG. 4 will be made reference to.

In the D/A conversion section 203, the first tone reference current-the third tone reference current are selected by a digital video signal inputted from the second latch circuit 213. In this way, the D/A conversion section 203 outputs an analog current (signal current) corresponding to the digital video signal into the control current lines CS1-CS4.

It should be noted that as a configuration of the shift resistor 211 configuring the signal line drive circuit, the first latch circuit 212 and the second latch circuit 213, the circuit with the known configuration is capable of being freely used.

Moreover, instead of the shift resistor 211, a decoder or the like is capable of being used.

Figure 5:
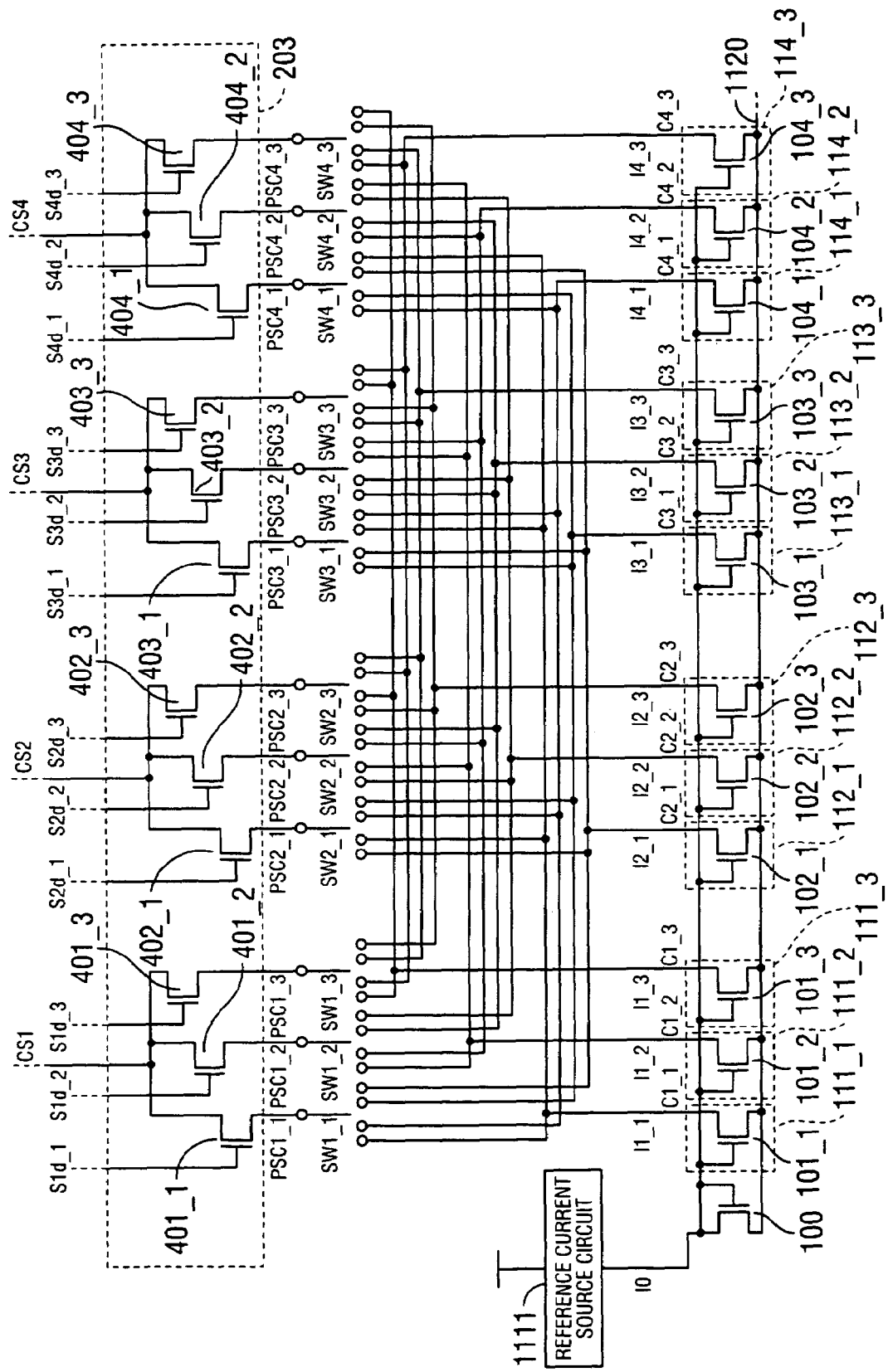
FIG. 5 is a diagram showing the configuration of a control current output circuit of the present invention.

In FIG. 5, a circuit diagram concretely showing the configuration of the first control current output circuit 200A and the second control current output circuit 200B and the third control current output circuit 200C of the signal line drive circuit 220, and the D/A conversion section 203 of the configuration shown in FIG. 4 is shown.

The structure and the operation of the signal line drive circuit 220 will be described below with reference to FIG. 5.

The first quasi control current output circuit 202A is configured by depositing 4 pieces of the quasi control current output circuits 111_1-114_1. The second quasi control current output circuit 202B is configured by depositing 4 pieces of the quasi control current output circuits 111-2-114-2. The third quasi control current output circuit 202C is configured by depositing 4 pieces of the quasi control current output circuit 111_3-114_3.

Since the gate electrode and the drain terminal of the reference transistor 100 are connected each other, when the reference transistor 100 draws the drain current, it operates in the saturated region. Here, a certain current I0 inputted from the reference current source circuit 1111 is inputted between the source/drain terminals of the reference transistor 100. In this way, the reference transistor 100 flows the certain current I0 as a drain current.

In FIG. 5, as for the reference transistor 100, the transistors 101_1-104_1 that 4 pieces of the quasi control current output circuits 111_1-114_1 configuring the first quasi control current output circuit 202A have, the transistors 101_2-104_2 that 4 pieces of the quasi control current output circuits 111_2-114_2 configuring the second quasi control current output circuit 202B have and the transistors 101_3-104_3 that 4 pieces of the quasi control current output circuits 111_3-114_3 configuring the third quasi control current output circuit 202C have, their source terminals are connected to the power supply line, and their gate electrodes are electrically connected.

In this way, the gate voltage of the reference transistor 100 and the gate voltage of the transistors 101_1-104_1, 101_2-104_2 and 101_3-104_3 are equally maintained.

The drain terminals of the transistors 101_1-104_1 correspond to the output terminals of the first quasi control current output circuits, the drain terminals of the transistors 101-2-104-2 correspond to the output terminals of the second quasi control current output circuits, and the drain terminals of the transistors 101_3-104_3 correspond to the output terminals of the third quasi control current output circuits.

However, a gate width W1 and a gate length L1 of the transistors 101_1-104_1 configuring the first quasi control current output circuits 111_1-114_1 are all equally set. Moreover, a gate width W2 and a gate length L2 of the transistors 101_2-104_2 configuring the second quasi control current output circuits 111_2-114_2 are all equally set. Then, a gate width W3 and a gate length L3 of the transistors 101_3-104_3 configuring the third quasi control current output circuits 111_3-114_3 are all equally set. Here, the ratio W1/L1 of the gate width W1 and the gate length L1, the ratio W2/L2 of the gate width W2 and the gate length L2 and the ratio W3/L3 of the gate width W3 and the gate length L3 are set at different values.

For example, suppose that W1/L1:W2/L2:W3/L3 is 4:2:1. In this case, the ratio of the mean value I_1 of the current values of the currents I1_1-I4_1 that the first quasi control current output circuits 111_1-1214_1 output, the mean value I_2 of the current values of the currents I1_2-I4_2 that the second quasi control current output circuits 111_2-114_2 output and the mean value I_3 of the current values of the currents I1_3-I4_3 that the third quasi control current output circuits 111_3-114_3 output can be made 4:2:1.

Here, as for the reference transistor 100 and the transistors 101_1-104_1, 101_2-104_2 and 101_3-104_3, although these may be either of an n-channel type TFT or a p-channel type TFT, the polarities of the reference transistor 100 and the transistors 101_1-104_1, 101_2-104_2 and 101_3-104_3 have to be the same.

The electric characteristics of the transistors 101_1-104_1 are uniform, the current values of the currents I1_1-I4_1 are equal to each other. The electric characteristics of the transistors 101_2-104_2 are uniform, the current values of the currents I1_2-I4_2 are equal to each other. The electric characteristics of the transistors 101_3-104_3 are uniform, the current values of the currents I1_3-I4_3 are equal to each other. However, since the transistors 101_1-104_1, 101_2-104_2 and 101_3-104_3 are polycrystalline TFTS, actually, the dispersion of the currents I1_1-I4_1, the dispersion of the currents I1_2-I4_2 and the dispersion of the currents I1_3-I4_3 are large.

Next, the configurations of the switches SW1_1-SW1_3, SW2_1-SW2_3, SW3_1-SW3_3 and SW4_1-SW4_3 will be described below.

The output currents I1_1-I4_1 of the first quasi control current output circuits 111_1-114_1 are exchanged periodically for PCS1_1, PCS2_1, PCS3_1 and PCS4_1, for example, per each one frame time period by the switches SW1_1, SW2_1, SW3_1 and SW4_1, and outputted.

The output currents I1_2-I4_2 of the second quasi control current output circuits 111_2-114_2 are exchanged periodically for PCS1_2, PCS2_2, PCS3_2 and PCS4_2, for example, per each frame time period by the switches SW1_2, SW2_2, SW3_2 and SW4_2, and outputted.

The output currents I1_3-I4_3 of the third quasi control current output circuits 111_3-114_3 are exchanged periodically for PCS1_3, PCS2_3, PCS3_3 and PCS4_3, for example, per each frame time period by the switches SW1_3, SW2_3, SW3_3 and SW4_3, and outputted.

The configurations and its driving methods of switches (SW1_p-SW4_p) corresponding to the respective quasi control current output circuits (111_1-114_1, 111_2-114_2 and 111_3-114_3) of the respective sets are capable of being similar to the configurations shown as SW1-SW4 in FIG. 2, and the timing charts of FIG. 3 in Embodiment, therefore, here, the description in detail is omitted.

The currents outputted from PCS1_1, PCS2_1, PCS3_1 and PCS4_1 corresponding to the first tone reference current are temporarily averaged by the above-described configuration. Moreover, the currents outputted from PCS1_2, PCS2_2, PCS3_2 and PCS4_2 corresponding to the second tone reference currents are temporarily averaged by the above-described configuration. Then, the currents outputted from PCS1_3, PCS2_3, PCS3_3 and PCS4_3 corresponding to the third tone reference current are temporarily averaged by the above-described configuration.

Next, the D/A conversion section 203 will be described below.

The portion outputting a signal current into the control current line CS1 is configured by depositing the transistors 401_1-401_3.

The first order bit of the digital video signal is inputted via the wiring S1$d$_1 from the second latch circuit 213 to the gate electrode of the transistor 401_1. One of the source terminal or the drain terminal of the transistor 401_1 is connected to PCS1_1, and the other one is connected to the control current line CS1.

The second order bit of the digital video signal is inputted via the wiring S1$d$_2 from the second latch circuit 213 to the gate electrode of the transistor 401_2. One of the source terminal or the drain terminal of the transistor 401_2 is connected to PCS1_2, and the other one is connected to the control current line CS1.

The third order bit of the digital video signal is inputted via the wiring S1$d$_3 from the second latch circuit 213 to the gate electrode of the transistor 401_3. One of the source terminal or the drain terminal of the transistor 401_3 is connected to PCS1_3, and the other one is connected to the control current line CS1.

The portion corresponding to the control current lines CS2-CS4 is also similar to the portion corresponding to the control current line CS1.

In one portion of the D/A conversion section 203 outputting the signal current to the control current line CS1, via the transistor which has been in a state of being conductive by the digital video signal inputted via the wirings S1d_1-S1d_3 from the second latch circuit 213 out of the transistors 401_1-401_3, the first tone reference current-the third tone reference current are selectively flown. In this way, an analog signal current corresponding to the digital video signal is outputted to the control current line CS1.

Also to the control current lines CS2-CS4, similarly, an analog signal current corresponding to the digital video signal is outputted.

In this way, the dispersion of the brightness of their luminous elements can be visually reduced in the pixels into which an analog signal current for being outputted to the respective control current lines CS1-CS4 is inputted.

It should be noted that in the present Example, only the control current output circuits corresponding to 4 of control current lines have been representatively shown. In general, all of the control current lines into which the control current is inputted into each pixel of the display device are divided into a plurality of sets, and in the respective sets, it is configured so that the control current is outputted from the control current output circuit of the configuration similar to those of FIG. 4 and FIG. 5.

In this way, the visual dispersion of the brightness of the luminous elements of each pixel that the display device has can be reduced.

Figure 7:
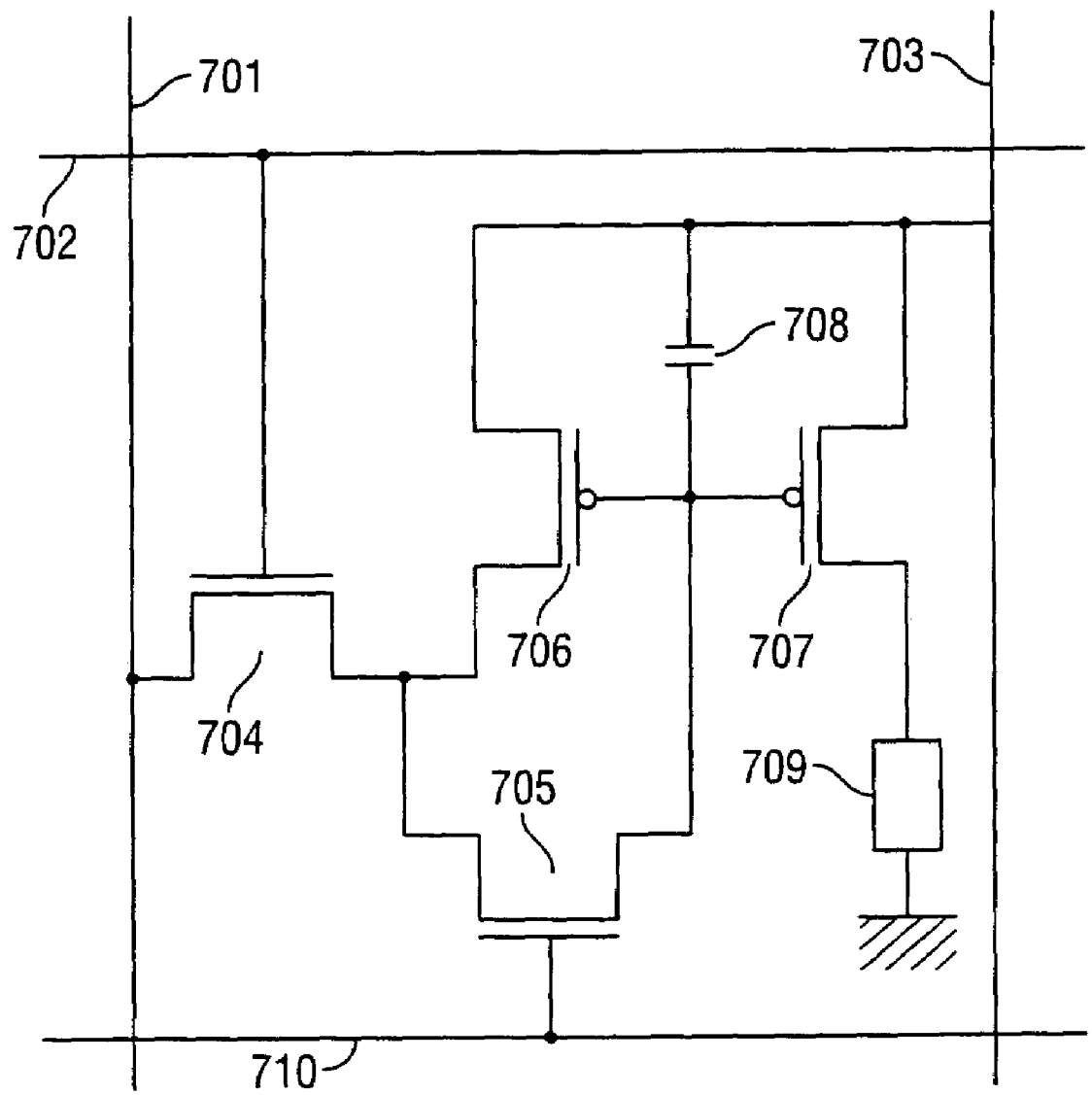
FIG. 7 is a diagram showing the configuration of a pixel of a display device.
Figure 8:
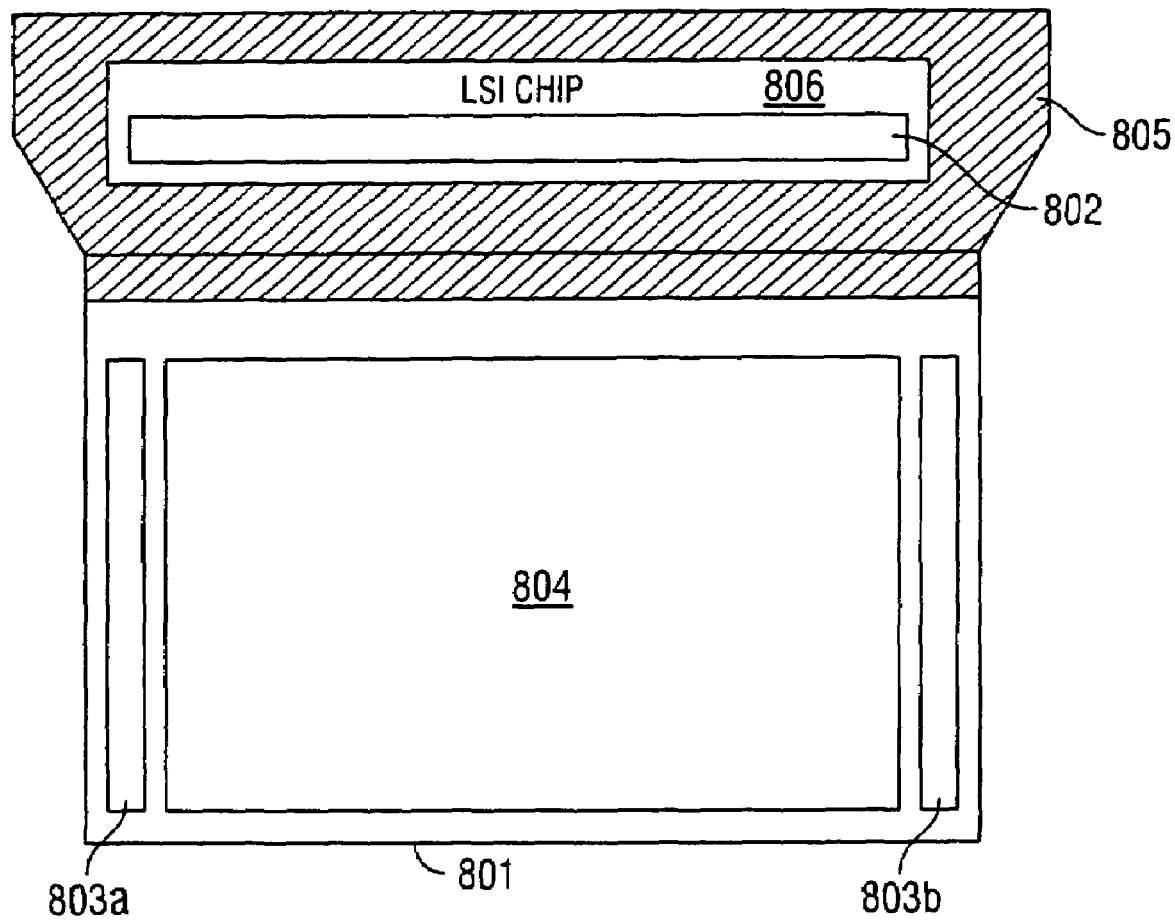
FIG. 8 is a block diagram showing the configuration of the conventional display device.

It should be noted that for a pixel configuration of a display device in the present Example, an analog signal current is inputted as a control current for controlling the luminous brightness of the luminous elements of each pixel, and a type of a pixel for displaying can be freely used. For example, in the conventional example, a pixel of such a configuration as shown in FIG. 7 can be used.

It should be noted that in the present Example, a signal control circuit in which it is configured so that one reference current source circuit is shared with a plurality of control current output circuits and a plurality of tone reference currents are generated is exemplified, but the present invention is not limited to this. The present invention can be also easily applied to a signal line drive circuit of the configuration in which the reference current source circuit outputting the currents of the different current values is provided per a plurality of control current output circuits.

Example 2

In this example, a technique of forming a pixel portion and a driver circuit portion of the display device of the present invention by using TFTs on a substrate with an insulation surface will be described below.

To be brief, as elements which comprise pixels, a switching transistor which selects the input of the signal current to the pixel, a driver transistor which supplies the current to the light emitting element, and a light emitting element are shown as representatives. And elements which comprise the driver circuit portion, a CMOS circuit which are consisted of an n-channel transistor and a p-channel transistor are also shown as representative.

Figure 9A:
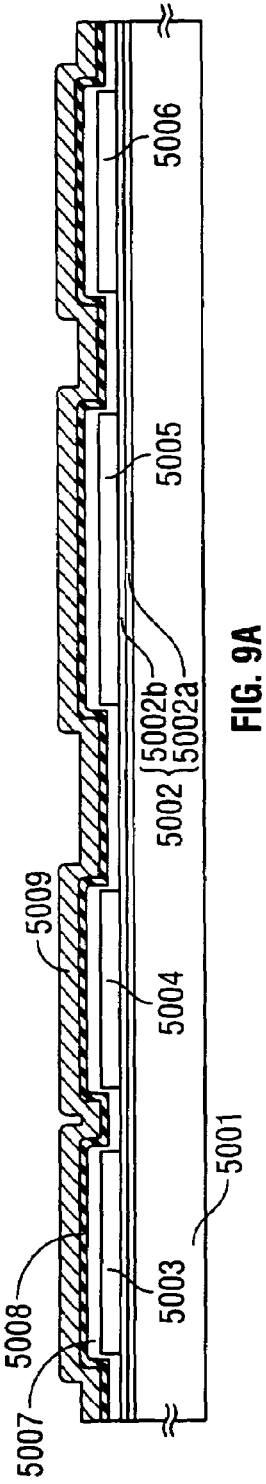
FIGS. 9A to 9C are diagrams showing the preparing steps of a display device of the present invention.

First, as shown in FIG. 9A, a base film 5002 consist of an insulating film such as a silicon oxide film, a silicon nitride film or a silicon oxynitride film is formed on a substrate 5001 consist of glass such as barium borosilicate glass or alumino borosilicate glass represented by #7059 glass and #1737 glass of Coning Corporation. For example, a silicon oxynitride film 5002a formed from $SiH_4$, $NH_3$ and $N_2O$ by the plasma CVD method and having a thickness of from 10 to 200 nm (preferably 50 to 100 nm) is formed. Similarly, a hydrogenerated silicon oxynitride film 5002b formed from $SiH_4$ and $N_2O$ and having a thickness of from 50 to 200 nm (preferably 100 to 150 nm) is layered thereon. In this example, the base film 5002 has a two-layer structure, but may also be formed as a single layer film of one of the above insulating films, or a laminate film having more than two layers of the above insulating films.

Next, a semiconductor film having an amorphous structure is formed and patterned as Island-like semiconductor layers 5003 to 5006. Then, a crystalline semiconductor film is obtained by conducting laser crystallization method or a known thermal crystallization method on a semiconductor film having an amorphous structure. Each of these island-like semiconductor layers 5003 to 5006 has a thickness of from 25 to 80 nm (preferably 30 to 60 nm). No limitation is put on the material of the semiconductor film, but the semiconductor film is preferably formed from silicon, a silicon germanium (SiGe) alloy, etc.

When the crystalline semiconductor film is to be manufactured by the laser crystallization method, an excimer laser, a YAG laser and an $YVO_4$ laser of a pulse oscillation type or continuous light emitting type are used. When these lasers are used, it is preferable to use a method in which a laser beam radiated from a laser oscillator is converged into a linear shape by an optical system and then is irradiated to the semiconductor film. A crystallization condition is suitably selected by an operator. When the excimer laser is used, pulse oscillation frequency is set to 30 Hz, and laser energy density is set to from 100 to 400 $mJ/cm^2$ (typically 200 to 300 $mJ/cm^2$). When the YAG laser is used, pulse oscillation frequency is preferably set to from 1 to 10 kHz by using its second harmonic, and laser energy density is preferably set to from 300 to 600 $mJ/cm^2$ (typically 350 to 500 $mJ/cm^2$). The laser beam converged into a linear shape and having a width of from 100 to 1000 μm, e.g. 400 μm is, is irradiated to the entire substrate surface. At this time, overlapping ratio of the linear laser beam is set to from 50 to 98%.

Next, a gate insulating film 5007 covering the island-like semiconductor layers 5003 to 5006 is formed. The gate insulating film 5007 is formed from an insulating film containing silicon and having a thickness of from 40 to 150 nm by using the plasma CVD method or a sputtering method. In this example, the gate insulating film 5007 is formed from a silicon oxynitride film with a thickness of 120 nm. However, the gate insulating film is not limited to such a silicon oxynitride film, but it may be an insulating film containing other silicon and having a single layer or a laminated layer structure. For example, when a silicon oxide film is used, TEOS (Tetraethyl Orthosilicate) and $O_2$ are mixed by the plasma CVD method, the reaction pressure is set to 40 Pa, the substrate temperature is set to from 300 to 400° C., and the high frequency (13.56 MHz) power density is set to from 0.5 to 0.8 $W/cm^2$ for electric discharge. Thus, the silicon oxide film can be formed by discharge. The silicon oxide film manufactured in this way can then obtain preferable characteristics as the gate insulating film by thermal annealing at from 400 to 500° C.

A first conductive film 5008 and a second conductive film 5009 for forming a gate electrode are formed on the gate insulating film 5007. In this example, the first conductive film 5008 having a thickness of from 50 to 100 nm is formed from Ta, and the second conductive film 5009 having a thickness of from 100 to 300 nm is formed from W.

The Ta film is formed by a sputtering method, and the target of Ta is sputtered by Ar. In this case, when suitable amounts of Xe and Kr are added to Ar, internal stress of the Ta film is released, and pealing off this film can be prevented. Resistivity of the Ta film of a phase is about 20 μΩcm, and this Ta film can be used for the gate electrode. However, resistivity of the Ta film of β phase is about 180 μΩcm, and is not suitable for the gate electrode. When tantalum nitride having a crystal structure close to that of the α phase of Ta and having a thickness of about 10 to 50 nm is formed in advance as the base for the Ta film to form the Ta film of the α phase, the Ta film of α phase can be easily obtained.

The W film is formed by the sputtering method with W as a target. Further, the W film can be also formed by a thermal CVD method using tungsten hexafluoride ($WF_6$). In any case, it is necessary to reduce resistance to use this film as the gate electrode. It is desirable to set resistivity of the W film to be equal to or smaller than 20 μΩcm. When crystal grains of the W film are increased in size, resistivity of the W film can be reduced. However, when there are many impurity elements such as oxygen, etc. within the W film, crystallization is prevented and resistivity is increased. Accordingly, in the case of the sputtering method, a W-target of 99.9999% or 99.99% in purity is used, and the W film is formed by taking a sufficient care of not mixing impurities from a gaseous phase into the W film time when the film is to be formed. Thus, a resistivity of from 9 to 20 μΩcm can be realized.

In this example, the first conductive film 5008 is formed from Ta, and the second conductive film 5009 is formed from W. However, the present invention is not limited to this case. Each of these conductive films may also be formed from an element selected from Ta, W, Ti, Mo, Al and Cu, or an alloy material or a compound material having these elements as principal components. Further, a semiconductor film represented by a polysilicon film doped with an impurity element such as phosphorus may also be used. Examples of combinations other than those shown in this example include: a combination in which the first conductive film 5008 is formed from tantalum nitride (TaN), and the second conductive film 5009 is formed from W; a combination in which the first conductive film 5008 is formed from tantalum nitride (TaN), and the second conductive film 5009 is formed from Al; and a combination in which the first conductive film 5008 is formed from tantalum nitride (TaN), and the second conductive film 5009 is formed from Cu.

Next, a mask 5010 is formed from a resist, and first etching processing for forming an electrode and wiring is performed. In this example, an ICP (Inductively Coupled Plasma) etching method is used, and $CF_4$ and $Cl_2$ are mixed with a gas for etching. RF (13.56 MHz) power of 500 W is applied to the electrode of coil type at a pressure of 1 Pa so that plasma is generated. RF (13.56 MHz) of 100 W power is also applied to a substrate side (sample stage), and a substantially negative self bias voltage is applied. When $CF_4$ and $Cl_2$ are mixed, the W film and the Ta film are etched to the same extent.

Under the above etching condition, end portions of a first conductive layer and a second conductive layer are formed into a tapered shape by effects of the bias voltage applied to the substrate side by making the shape of the mask formed from the resist into an appropriate shape. The angle of a taper portion is set to from 15° to 45°. It is preferable to increase an etching time by a ratio of about 10 to 20% so as to perform the etching without leaving the residue on the gate insulating film. Since a selection ratio of a silicon oxynitride film to the W film ranges from 2 to 4 (typically 3), an exposed face of the silicon oxynitride film is etched by about 20 to 50 nm by over-etching processing. Thus, conductive layers 5011 to 5016 of a first shape (first conductive layers 5011a to 5016a and second conductive layers 5011b to 5016b) formed of the first and second conductive layers are formed by the first etching processing. A region that is not covered with the conductive layers 5011 to 5016 of the first shape is etched by about 20 to 50 nm in the gate insulating film 5007, so that a thinned region is formed.

Figure 9B:
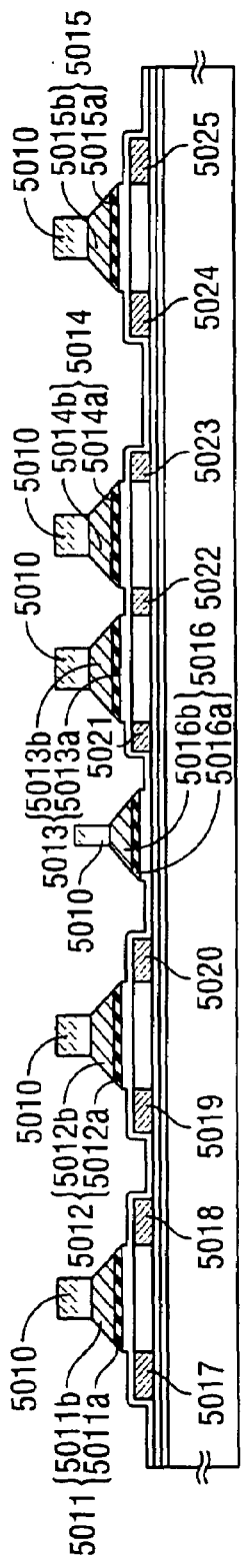

Then, an impurity element for giving an n-type conductivity is added by performing first doping processing. A doping method may be either an ion doping method or an ion implantation method. The ion doping method is carried out under the condition that a dose is set to from $1 \times 10^{13}$ to $5 \times 10^{14}$ atoms/cm$^2$, and an acceleration voltage is set to from 60 to 100 keV. An element belonging to group 15, typically, phosphorus (P) or arsenic (As) is used as the impurity element for giving the n-type conductivity. However, phosphorus (P) is used here. In this case, the conductive layers 5011 to 5015 serve as masks with respect to the impurity element for giving the n-type conductivity, and first impurity regions 5017 to 5025 are formed in a self-aligning manner. The impurity element for giving the n-type conductivity is added to the first impurity regions 5017 to 5025 in a concentration range from $1 \times 10^{20}$ to $1 \times 10^{21}$ atoms/cm$^3$ (FIG. 9B).

Figure 9C:
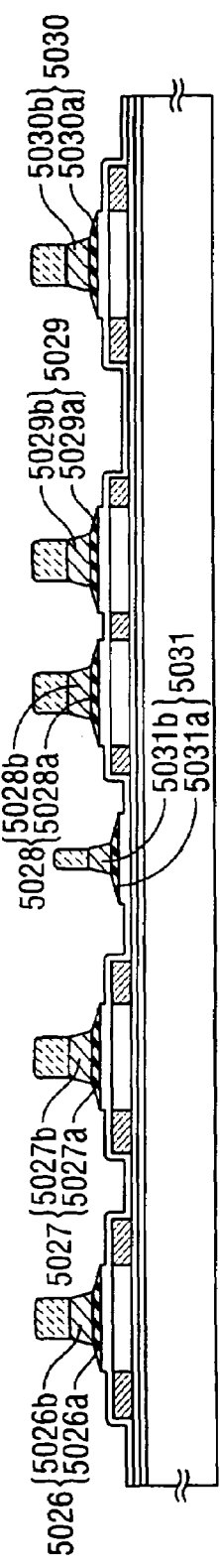

Second etching processing is next performed without removing the resist mask 310 as shown in FIG. 9C. A W film is etched selectively by using $CF_4$, $Cl_2$ and $O_2$ as the etching gas. The conductive layers 5026 to 5031 of a second shape (first conductive layers 5026a to 5031a and second conductive layers 5026b to 5031b) are formed by the second etching processing. A region of the gate insulating film 5007, which is not covered with the conductive layers 5026 to 5031 of the second shape, is further etched by about 20 to 50 nm so that a thinned region is formed.

An etching reaction in the etching of the W film or the Ta film using the mixed gas of $CF_4$ and $Cl_2$ can be assumed from the vapor pressure of a radical or ion species generated and a reaction product. When the vapor pressures of a fluoride and a chloride of W and Ta are compared, the vapor pressure of $WF_6$ as a fluoride of W is extremely high, and vapor pressures of other $WCl_5$, $TaF_5$ and $TaCl_5$ are approximately equal to each other. Accordingly, both the W film and the Ta film are etched using the mixed gas of $CF_4$ and $Cl_2$. However, when a suitable amount of $O_2$ is added to this mixed gas, $CF_4$ and $O_2$ react and become CO and F so that a large amount of F-radicals or F-ions is generated. As a result, the etching speed of the W film whose fluoride has a high vapor pressure is increased. In contrast to this, the increase in etching speed is relatively small for the Ta film when F is increased. Since Ta is easily oxidized in comparison with W, the surface of the Ta film is oxidized by adding $O_2$. Since no oxide of Ta reacts with fluorine or chloride, the etching speed of the Ta film is further reduced. Accordingly, it is possible to make a difference in etching speed between the W film and the Ta film so that the etching speed of the W film can be set to be higher than that of the Ta film.

As shown in FIG. 10A, second doping processing is then performed. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 keV, and the dose is set to $1 \times 10^{13}$ atoms/cm$^2$. Thus, a new impurity region is formed inside the first impurity region formed in the island-like semiconductor layer in FIG. 9B. In the doping, the conductive layers 5026 to 5030 of the second shape are used as masks with respect to the impurity element, and the doping is performed such that the impurity element is also added to regions underside the first conductive layers 5026a to 5030a. Thus, third impurity regions 5032 to 5036 are formed. The third impurity regions 5032 to 5036 contain phosphorus (P) with a gentle concentration gradient that conforms with the thickness gradient in the tapered portions of the first conductive layers 5026a to 5030a. In the semiconductor layers that overlap the tapered portions of the first conductive layers 5026a to 5030a, the impurity concentration is slightly lower around the center than at the edges of the tapered portions of the first conductive layers 5026a to 5030a. However, the difference is very slight and almost the same impurity concentration is kept throughout the semiconductor layers.

Third etching treatment is then carried out as shown in FIG. 10B. $CHF_6$ is used as etching gas, and reactive ion etching (RIE) is employed. Through the third etching treatment, the tapered portions of the first conductive layers 5026a to 5031a are partially etched to reduce the regions where the first conductive layers overlap the semiconductor layers. Thus formed are third shape conductive layers 5037 to 5042 (first conductive layers 5037a to 5042a and second conductive layers 5037b to 5042b). At this point, regions of the gate insulating film 5007 that are not covered with the third shape conductive layers 5037 to 5042 are further etched and thinned by about 20 to 50 nm.

Third impurity regions 5032 to 5036 are formed through the third etching treatment. The third impurity regions 5032a to 5036a that overlap the first conductive layers 5037a to 5041a, respectively, and second impurity regions 5032b to 5036b each formed between a first impurity region and a third impurity region.

As shown in FIG. 10C, fourth impurity regions 5043 to 5054 having the opposite conductivity type to the first conductivity type are formed in the island-like semiconductor layers 5004 and 5006 for forming p-channel type TFTs. The third shape conductive layers 5038b and 5041b are used as masks against the impurity element and impurity regions are formed in a self-aligning manner. At this point, the island-like semiconductor layers 5003 and 5005 for forming n-channel type TFTs are entirely covered with a resist mask 5200. The impurity regions 5043 to 5054 have already been doped with phosphorus in different concentrations. The impurity regions 5043 to 5054 are doped with diborane ($B_2H_6$) through ion doping and its impurity concentrations are set to form $2 \times 10^{20}$ to $2 \times 10^{21}$ atoms/cm$^3$ in the respective impurity regions.

Through the steps above, the impurity regions are formed in the respective island-like semiconductor layers. The third shape conductive layers 5037 to 5041 overlapping the island-like semiconductor layers function as gate electrodes. Further 5042 functions as an island-like signal line.

After resist mask 5200 is removed, a step of activating the impurity elements added to the island-like semiconductor layers is performed to control the conductivity type. This process is performed by a thermal annealing method using a furnace for furnace annealing. Further, a laser annealing method or a rapid thermal annealing method (RTA method) can be applied. In the thermal annealing method, this process is performed at a temperature of from 400 to 700° C., typically from 500 to 600° C. within a nitrogen atmosphere in which oxygen concentration is equal to or smaller than 1 ppm and is preferably equal to or smaller than 0.1 ppm. In this example, heat treatment is performed for four hours at a temperature of 500° C. When a wiring material used in the third shape conductive layers 5037 to 5042 is weak against heat, it is preferable to perform activation after an interlayer insulating film (having silicon as a principal component) is formed in order to protect wiring, etc.

Further, the heat treatment is performed for 1 to 12 hours at a temperature of from 300 to 450° C. within an atmosphere including 3 to 100% of hydrogen so that the island-like semiconductor layer is hydrogenerated. This step is to terminate a dangling bond of the semiconductor layer by hydrogen thermally excited. Plasma hydrogenation (using hydrogen excited by plasma) may also be performed as another measure for hydrogenation.

Figure 11A:
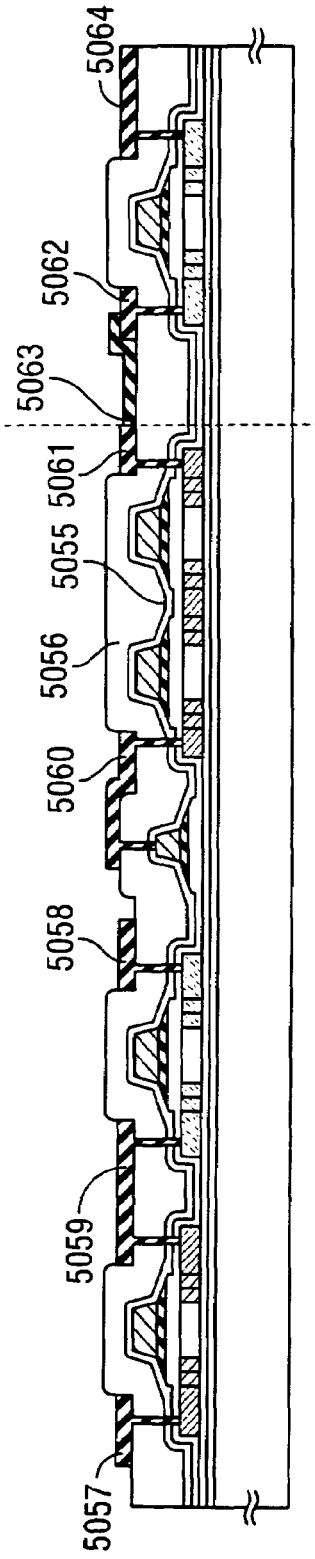
FIGS. 11A and 11B are diagrams showing the preparing steps of a display device of the present invention.

Next, as shown in FIG. 11A, a first interlayer insulating film 5055 is formed from a silicon oxynitride film with a thickness of 100 to 200 nm. The second interlayer insulating film 5056 from an organic insulating material is formed on the first interlayer insulating film. Thereafter, contact holes are formed through the first interlayer insulating film 5055, the second interlayer insulating film 5056 and the gate insulating film 5007, and after wirings (include connecting wiring and signal wiring) 5057 to 5062 and 5067 are patterned and formed, a pixel electrode 5063 connected to the connecting wiring 5062 is patterned and formed.

A film having an organic resin as a material is used as the second interlayer insulating film 5056. Polyimide, polyamide, acrylic, BCB (benzocyclobutene), etc. can be used as this organic resin. In particular, since the second interlayer insulating film 5056 is provided mainly for planarization, acrylic excellent in leveling the film is preferable. In this example, an acrylic film having a thickness that can sufficiently level a level difference caused by the TFT is formed. The film thickness thereof is preferably set to from 1 to 5 μm (is further preferably set to from 2 to 4 μm).

In the formation of the contact holes, contact holes reaching n-type impurity regions 5017, 5018, 5021, and 5023 or p-type impurity regions 5043 to 5054, a contact hole reaching the wiring 5042, a contact hole (not illustrated) reaching the power source wiring, and a contact hole (not illustrated) reaching the gate electrode are formed respectively.

Further, a laminate film of a three-layer structure is patterned in a desired shape and is used as connecting wirings 5057 to 5062 and 5064. In this three-layer structure, a Ti film with a thickness of 100 nm, an aluminum film containing Ti with a thickness of 300 nm, and a Ti film with a thickness of 150 nm are continuously formed by the sputtering method. Of course, another conductive film may also be used.

In this example, an ITO film of 110 nm in thickness is formed as a pixel electrode 5063, and is patterned. Contact is made by arranging the pixel electrode 5063 such that this pixel electrode 5063 comes in contact with the connecting wiring 5062 and is overlapped with this connecting wiring 5062. Further, a transparent conductive film provided by mixing 2 to 20% of zinc oxide (ZnO) with indium oxide may also be used. This pixel electrode 5063 becomes an anode of the light emitting element (FIG. 11A).

Figure 11B:
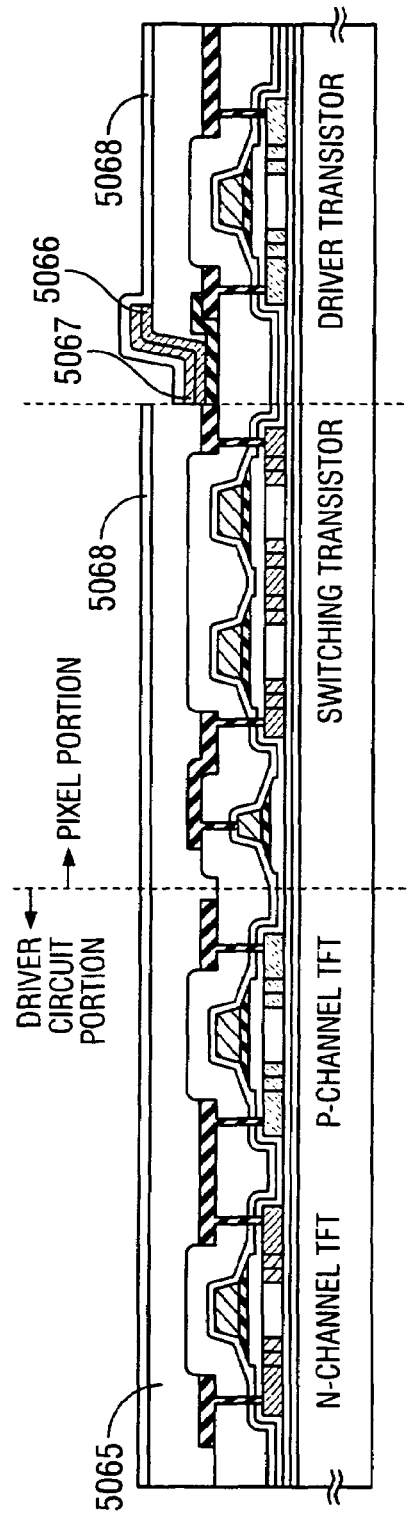

As shown in FIG. 11B, an insulating film (a silicon oxide film in this example) containing silicon and having a thickness of 500 nm is next formed. A third interlayer insulating film 5065 functions as a bank is formed in which an opening is formed in a position corresponding to the pixel electrode 5063. When the opening is formed, a side wall of the opening can easily be tapered by using the wet etching method. When the side wall of the opening is not gentle enough, deterioration of an organic compound layer caused by a level difference becomes a notable problem.

Next, an organic compound layer 5066 and a cathode (MgAg electrode) 5067 are continuously formed by using the vacuum evaporation method without exposing to the atmosphere. The organic compound layer 5066 has a thickness of from 80 to 200 nm (typically from 100 to 120 nm), and the cathode 5067 has a thickness of from 180 to 300 nm (typically from 200 to 250 nm).

In this process, the organic compound layer is sequentially formed with respect to a pixel corresponding to red, a pixel corresponding to green and a pixel corresponding to blue. In this case, since the organic compound layer has an insufficient resistance against a solution, the organic compound layer must be formed separately for each color instead of using a photolithography technique. Therefore, it is preferable to cover a portion except for desired pixels using a metal mask so that the organic compound layer is formed selectively only in a required portion.

Namely, a mask for covering all portions except for the pixel corresponding to red is first set, and the organic compound layer for emitting red light are selectively formed by using this mask. Next, a mask for covering all portions except for the pixel corresponding to green is set, and the organic compound layer for emitting green light are selectively formed by using this mask. Next, a mask for covering all portions except for the pixel corresponding to blue is similarly set, and the organic compound layer for emitting blue light are selectively formed by using this mask. Here, different masks are used, but instead the same single mask may be used repeatedly.

Here, a system for forming three kinds of light emitting element corresponding to RGB is used. However, a system in which an light emitting element for emitting white light and a color filter are combined, a system in which the light emitting element for emitting blue or blue green light is combined with a fluorescent substance (a fluorescent color converting medium: CCM), a system for overlapping the light emitting elements respectively corresponding to R, G, and B with the cathodes (opposite electrodes) by utilizing a transparent electrode, etc. may be used.

A known material can be used as the organic compound layer 5066. An organic material is preferably used as the known material in consideration of a driving voltage. For example, a four-layer structure consisting of a hole injection layer, a hole transportation layer, a light emitting layer and an electron injection layer is preferably used for the organic light emitting layer.

Next, the cathode 5067 is formed. This example uses MgAg for the cathode 5067 but it is not limited thereto. Other known materials may be used for the cathode 5067.

Lastly, a passivation film 5068 is formed from a silicon nitride film with a thickness of 300 nm. The passivation film 5068 protects the organic compound layer 5066 from moisture and the like, thereby further enhancing the reliability of the LIGHT EMITTING ELEMENT. However, the passivation film 5068 may not necessarily be formed.

A light emitting device structured as shown in FIG. 11B is thus completed. Note that in the manufacturing process of the display device in this example, because of the configuration of circuit and the process, although the signal lines are formed from Ta and W which are materials for forming the gate electrodes, and the gate signal lines are formed from A1 which is a material for forming the drain and source electrodes, but different materials may be used.

The light emitting device of this example exhibits very high reliability and improved operation characteristics owing to placing optimally structured TFTs in not only the pixel portion but also in the driving circuits. In the crystallization step, the film may be doped with a metal catalyst such as Ni to enhance the crystallinity. By enhancing the crystallinity, the drive frequency of the signal line driving circuit can be set to 10 MHz or higher.

First, a TFT having a structure in which hot carrier injection is reduced without decreasing the operating speed as much as possible is used as an n-channel TFT of a CMOS circuit forming the driver circuit portion.

In Example 2, the active layer of the n-channel TFT contains the source region, the drain region, the LDD (lightly doped drain) region overlapping with the gate electrode with the gate insulating film sandwiched therebetween (Lov region), the LDD region not overlapping with the gate electrode with the gate insulating film sandwiched therebetween (Loff region), and the channel forming region.

Further, there is not much need to worry about degradation due to the hot carrier injection with the p-channel TFT of the CMOS circuit, and therefore LDD regions may not be formed in particular. It is of course possible to form LDD regions similar to those of the n-channel TFT, as a measure against hot carriers.

In addition, when using a CMOS circuit in which electric current flows in both directions in the channel forming region, namely a CMOS circuit in which the roles of the source region and the drain region interchange, it is preferable that LDD regions be formed on both sides of the channel forming region of the n-channel TFT forming the CMOS circuit, sandwiching the channel forming region. Further, when a CMOS circuit in which it is necessary to suppress the value of the off current as much as possible is used, the n-channel TFT forming the CMOS circuit preferably has a Lov region.

Note that, in practice, it is preferable to perform packaging (sealing), without exposure to the atmosphere, using a protecting film (such as a laminated film or an ultraviolet cured resin film) having good airtight properties and little out gassing, or a transparent sealing material, after completing through the state of FIG. 11B. At this time, the reliability of the light emitting element is increased by making an inert atmosphere on the inside of the sealing material and by arranging a drying agent (barium oxide, for example) inside the sealing material.

Further, after the airtight properties have been increased by the packaging process, a connector (flexible printed circuit: FPC) is attached in order to connect terminals led from the elements or circuits formed on the substrate with external signal terminals. Then, a finished product is completed.

Furthermore, in accordance with the process shown in Example 5, the number of photo masks required for manufacture of a display device can be suppressed. As a result, the process can be shortened, and the reduction of the manufacturing cost and the improvement of the yield can be attained.

Example 2 can be performed by freely combining with Example 1.

Example 3

Figure 19:
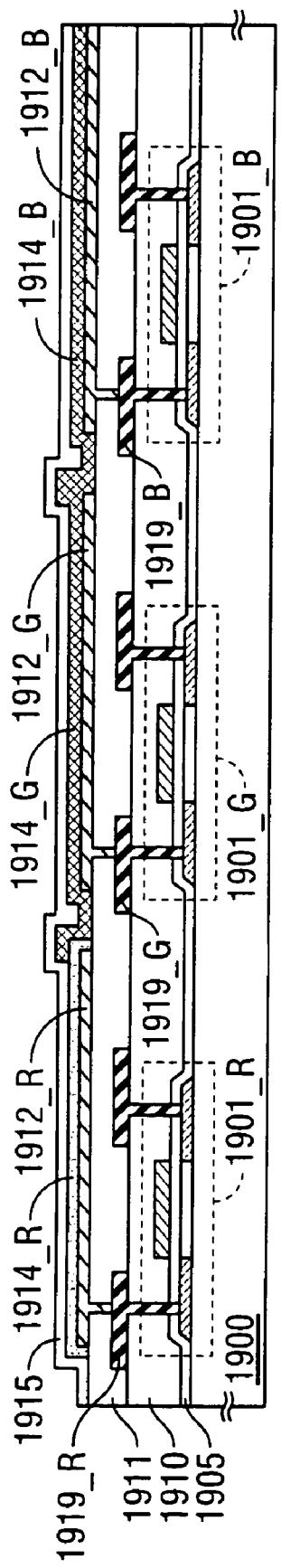
FIG. 19 is a sectional view showing the structure of a display device of the present invention.

A method of sealing the display device is described with FIG. 19. Here a pixel portion and a drive circuit provided in the periphery of the pixel portion are formed by using TFTs on an insulating substrate.

Figure 12A:
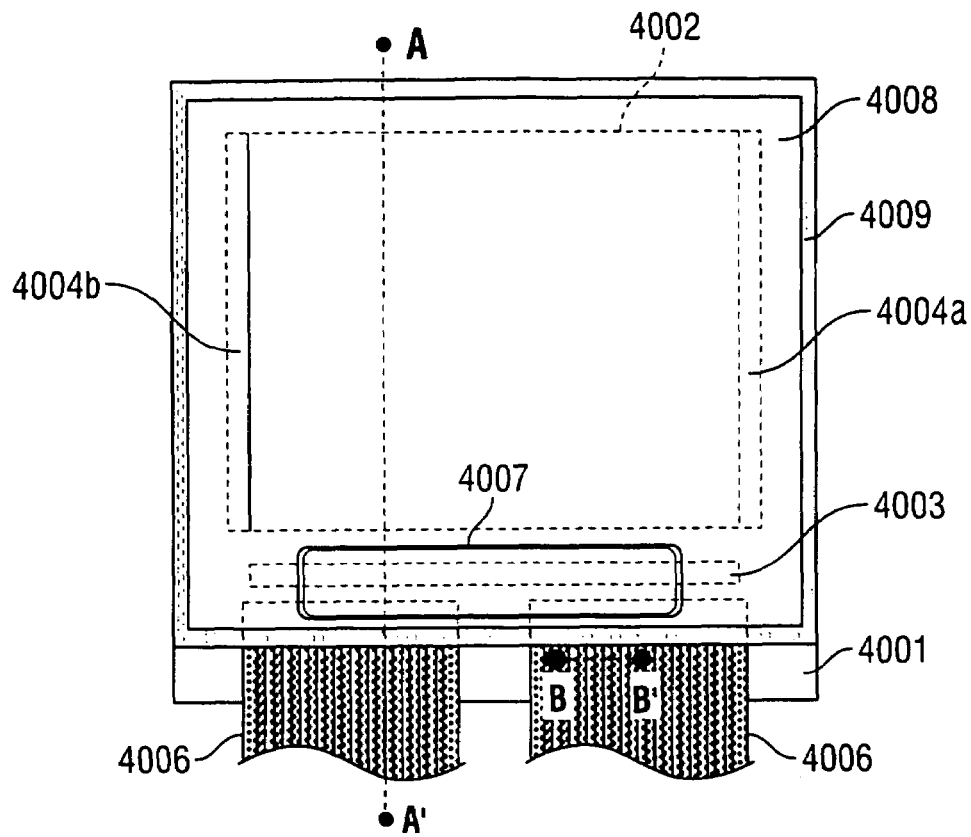
FIGS. 12A to 12C are a top view and sectional views showing the structure of a display device of the present invention.
Figure 12B:
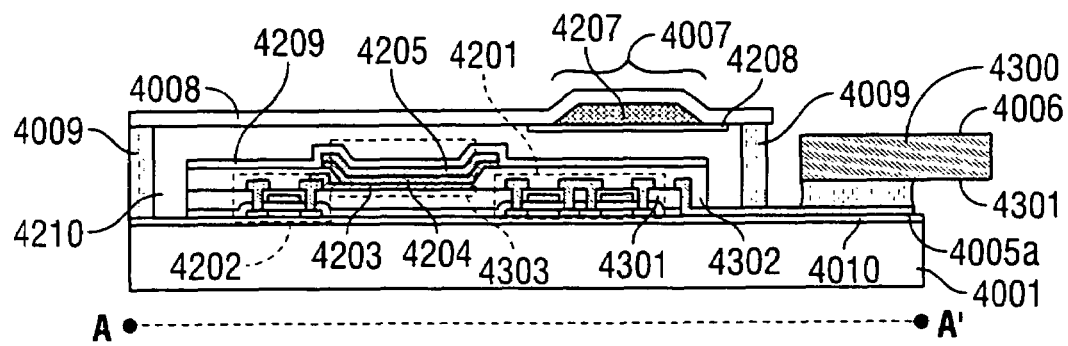
Figure 12C:
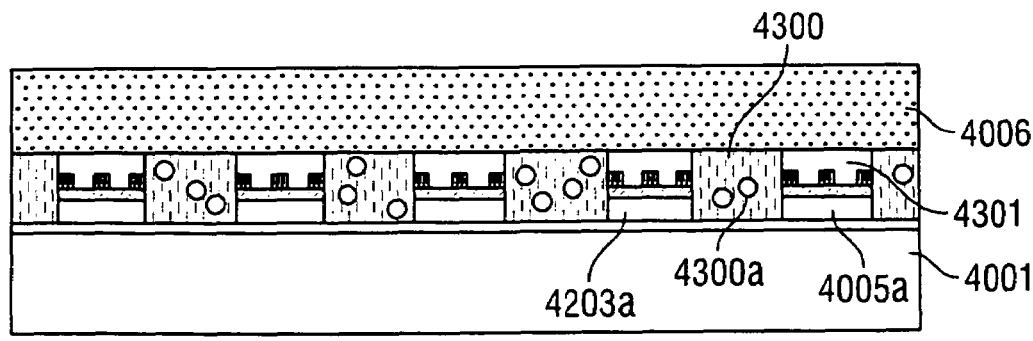

FIG. 12A is a top view of a display device, FIG. 12B is a cross-sectional view taken along a line A-A' of FIG. 12A, and FIG. 12C is a cross-sectional view taken along a line B-B' of FIG. 12A.

A seal member 4009 is provided so as to surround a combination of a pixel portion 4002, a signal line driver circuit 4003, a scanning line driver circuit 4004 (a first and a second scanning line driver circuits 4004a and 4004b) which are provided on a substrate 4001. Further, a sealing member 4008 is provided over the combination of a pixel portion 4002, a signal line driver circuit 4003, and a scanning line driver circuit 4004. Thus, the combination of a pixel portion 4002, a signal line driver circuit 4003, and a scanning line driver circuit 4004 are sealed by the substrate 4001, the seal member 4009, and the sealing member 4008 with a filler 4210.

Further a pixel portion 4002, a signal line driver circuit 4003, a first and a second scanning line driver circuits 4004a and 4004b provided on the substrate 4001 include a plurality of TFTs. FIG. 12B typically shows a driver circuit TFT (n-channel type TFT and p-channel type TFT are shown in this example) 4201 included in a signal line driver circuit 4003 and a driving TFT 4202 included in a pixel portion 4002, which are formed on an under film 4010.

In this example, the p-channel type TFT and the n-channel type TFT manufactured by a well-known method are used as the driver circuit TFT 4201, and a p-channel TFT manufactured by a well-known method is used as the driving TFT 4202. Further, a storage capacitor (not shown in the figure) connected to the gate of the driving TFT 4202 is provided at the pixel portion 4002.

A first interlayer insulating film (flattening film) 4301 is formed on the driver circuit TFT 4201 and the driving TFT 4202. Then, a pixel electrode (anode) 4203 electrically connected to a drain of the driving TFT 4202 is formed thereon. A transparent conductive film having a high work function is used as the pixel electrode 4203. A compound of indium oxide and tin oxide, a compound of indium oxide and zinc oxide, zinc oxide, tin oxide, or indium oxide can be used for the transparent conductive film. Further, the transparent conductive film added with gallium may be used.

An insulating film 4302 is formed on the pixel electrode 4203. An opening portion is formed in the insulating film 4302 over the pixel electrode 4203. In this opening portion, an organic compound layer 4204 is formed on the pixel electrode 4203. A well-known organic material or inorganic material can be used for the organic compound layer 4204. Although the organic material includes a low molecular system (monomer system) and a high molecular system (polymer system), either may be used.

As a formation method of the organic compound layer 4204, a well-known evaporation technique or coating technique may be used. The structure of the organic compound layer may be a laminate structure obtained by freely combining a hole injection layer, a hole transporting layer, a light emitting layer, an electron transporting layer, or an electron injection layer, or a single layer structure.

A cathode 4205 made of a conductive film (typically, a conductive film containing aluminum, copper or silver as its main ingredient, or a laminate film of those and another conductive films) having a light shielding property is formed on the organic compound layer 4204. It is desirable that moisture and oxygen existing on the interface between the cathode 4205 and the organic compound layer 4204 are removed to the utmost. Accordingly, it is necessary to make such contrivance that the organic compound layer 4204 is formed in a nitrogen or rare gas atmosphere, and the cathode 4205 is formed while the organic compound layer is not exposed to oxygen or moisture. In this embodiment, a multi-chamber system (cluster tool system) film forming apparatus is used, so that the film formation as described above is enabled. A predetermined voltage is applied to the cathode 4205.

In the manner as described above, a light-emitting element 4303 constituted by the pixel electrode (anode) 4203, the organic compound layer 4204, and the cathode 4205 are formed. Then, a protection film 4209 is formed on the insulating film 4302 so as to cover the light-emitting element 4303. The protection film 4209 is effective to prevent oxygen, moisture and the like from penetrating into the light-emitting element 4303.

Reference numeral 4005a designates a drawing wiring line connected to a power supply line and is electrically connected to a source region of the driving TFT 4202. The drawing wiring line 4005a passes between the seal member 4009 and the substrate 4001, and is electrically connected to an FPC wiring line 4301 included in an FPC 4006 through an anisotropic conductive film 4300.

As the sealing member 4008, a glass member, a metal member (typically, a stainless member), a ceramic member, or a plastic member (including a plastic film) can be used. As the plastic member, an FRP (Fiberglass-Reinforced Plastics) plate, a PVF (polyvinyl fluoride) film, a Mylar film, a polyester film or an acryl resin film can be used. Further, a sheet having such a structure that an aluminum foil is interposed between PVF films or Mylar films can also be used.

However, in the case when the radiation direction of light from the light-emitting element 4303 is directed toward the side of a cover member, the cover member must be transparent. In this case, a transparent material such as a glass plate, a plastic plate, a polyester film, or an acryl film is used.

As the filler 4210, in addition to an inert gas such as nitrogen or argon, ultraviolet ray curing resin or thermosetting resin can be used, and PVC (polyvinyl chloride), acryl, polyimide, epoxy resin, silicone resin, PVB (polyvinyl butyral), or EVA (ethylene-vinyl acetate) can be used. In this embodiment, nitrogen was used as the filler.

Further, in order to expose the filler 4210 to a hygroscopic material (preferably, barium oxide) or a material capable of adsorbing oxygen, a recess portion 4007 is provided on the surface of the sealing member 4008 on the side of the substrate 4001 and the hygroscopic material or the material 4207 capable of adsorbing oxygen is disposed. Then, in order to prevent the hygroscopic material or the material 4207 capable of adsorbing oxygen from scattering, the hygroscopic material or the material capable of adsorbing oxygen are held in the recess portion 4007 by a recess cover member 4208. Note that, the recess cover member 4208 is formed into a fine mesh, and has such a structure that air or moisture is permeated and the hygroscopic material or the material 4207 capable of adsorbing oxygen is not permeated. The deterioration of the light-emitting element 4303 can be suppressed by providing therewith the hygroscopic material or the material 4207 capable of adsorbing oxygen.

As shown in FIG. 12C, at the same time as the formation of the pixel electrode 4203, a conductive film 4203a is formed to be in contact with the drawing wiring line 4005a.

The anisotropic conductive film 4300 includes a conductive filler 4300a. The substrate 4001 and the FPC 4006 are thermally compressed, so that the conductive film 4203a on the substrate 4001 and the FPC wiring line 4301 on the FPC 4006 are electrically connected through the conductive filler 4300a.

Further, this example can be implemented by freely combining with Examples 1 to 2.

Example 4

In Example 4, the display device of the present invention is described by a cross-sectional view FIG. 17. In addition, in this example, as elements which consist of pixels of the display device, only a light emitting element and a transistor connected to a pixel electrode of the light emitting element are illustrated.

In FIG. 17, a transistor (driver transistor) 1601 is formed on a pixel substrate 1600.

The driver transistor 1601 has a gate electrode 1603, an insulating film 1605, and a channel formation region 1604b. One of a drain and a source regions of the driver transistor 1601 is 1604a, the other is 1604c. The channel formation region 1604b and 1604a, 1604c which correspond to the source region and drain region respectively are formed by a thin film semiconductor layer. An interlayer film 1606 is formed on the driver transistor 1601.

In addition, the driver transistor 1601 is not limited to the structure illustrated here, any TFTs having well known structure can be freely applied. For example, here, a signal gate TFT is used as the driver transistor 1601, but a multi gate TFT may be used. And a top gate TFT is used as the driver transistor 1601 here, but a bottom gate TFT may be used. Moreover, a dual gate TFT in which two gate electrodes are arranged at the above and the below portions of the channel region through a gate insulation film also is applicable.

Next, a material with reflectiveness is patterned to a desirable design and a pixel electrode 1608 is formed then. The pixel electrode 1608 serves as an anode here. A conduct hole is formed to reach the source and the drain regions 1604a, 1604c of the driver transistor 1601 on the interlayer film 1606. A laminated layer structured with a Ti, an Al including Ti, and a Ti is formed and patterned to a desirable design, thereby a wiring 1607 and a wiring 1609 are formed. The wiring 1609 and the pixel electrode 1608 become conductive by connecting with each other.

Subsequently, an insulation film made of an organic resin such as photosensitive acrylic and the like is formed, an opening portion is formed at a position corresponding to the pixel electrode 1608 of the light emitting element 1614, thereby an insulation film 1610 is formed.

At this time, the bottom of the insulation film opening portion is connected to the top of the pixel electrode 1608, and the bottom of the insulation film opening portion has a curved surface determined by a center of curvature (O1) of the upward of a tangent line of the pixel electrode and the bottom, and a first curvature radius (R1). Further, the top of the insulation film opening portion has a curved surface determined by a center of curvature (O2) of the downward of a tangent line of the top of the insulation film, the top and a second curvature radius (R2). Note that no matter how a etching process using a water solution of acid, base and the like, or a etching process using reactive gas, in actual process, as a controllable curvature radius, it is preferable to make the first curvature radius (R1) from 0.2 [m to 0.3 [m.

The bottom of the insulation film opening portion has a gentle curved surface changing serially so that the coverage of a light emitting layer formed on the opening portion is improved, and the disconnection of the light emitting layer in the bottom can be prevented. Herewith, the short circuit of the pixel electrode and the cathode by the disconnection of the light emitting layer can be reduced. Further, the light emitting layer can be prevented from becoming partly thinning, and a regional concentration of electric field in the light emitting layer also can be prevented.

After an organic compound layer 1611 is formed, a counter electrode (cathode) 1612 of a light emitting element 1614 is formed from a laminated layer constituted by a cesium (Cs) film at a thickness of 2 nm or less and a silver (Ag) film at a thickness of 10 nm or less in sequence. The film thickness of the counter electrode 1612 of the light emitting element 1614 is reduced extremely so that a light emitted from the light emitting layer 1611 can transmit the counter electrode 1612, and the light emission is in the direction opposite to the pixel substrate 1600. Subsequently, in order to protect the light emitting element 1614, the protection film 1613 is formed.

As described above, in case that the light emission is in the direction opposite to the pixel substrate 1600 in the display device, for the light emitting element 1614, the light emission of the light emitting element 1614 is not necessary to be checked visually via elements including such as the driver transistor 1601 formed on the pixel substrate 1600 side, therefore, the open area ratio thereof can be enlarged.

In addition, a TiN and the like is used as the material for the pixel electrode 1608, the pixel electrode serves as a cathode, whereas the counter electrode 1612 serves as an anode formed from a transparent conductive film typified by ITO and the like. As thus, it is practicable to take such a structure in which the light emitting layer 1611 emits light from the anode in the direction opposite to the pixel substrate 1600.

Figure 17A:
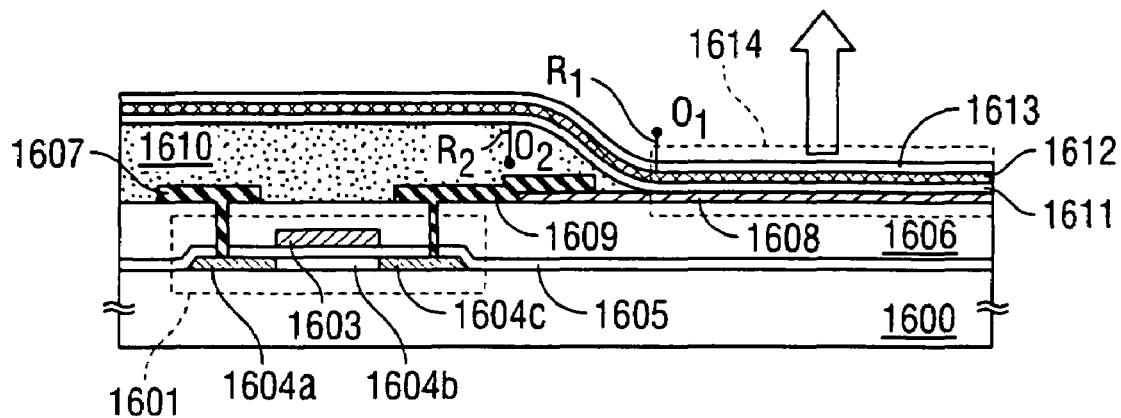
FIGS. 17A and 17B are sectional views showing the structure of a display device of the present invention.
Figure 17B:
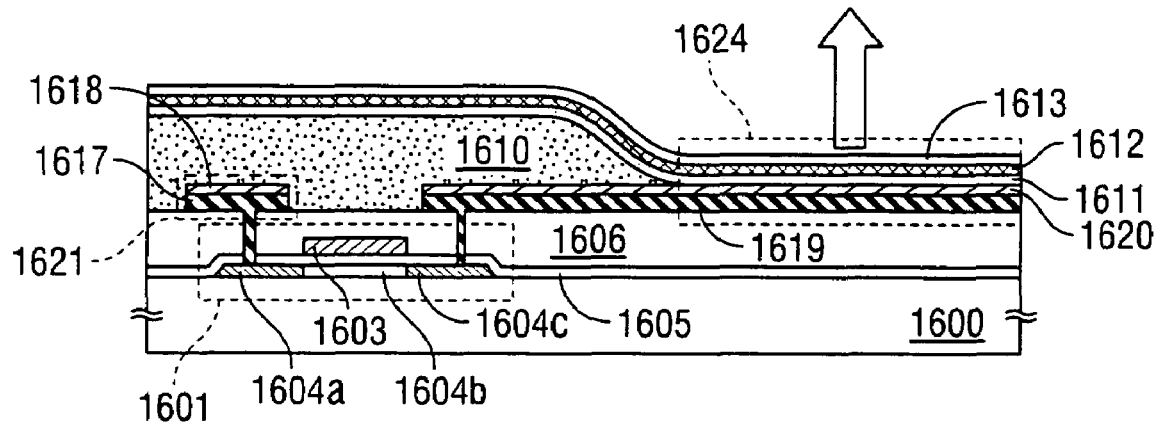

FIG. 17B is a cross-section view showing the configuration of a pixel having light emitting element, which is different from the one shown in FIG. 17A. In FIG. 17B, same parts as FIG. 17A will be explanted by utilizing same symbols with FIG. 17A, and the same parts can be manufactured along with the configuration shown in FIG. 17 unless and until the process of the formation of the driver transistor 1601 and interlayer 1606.

Subsequently, a conduct hole reaching the source and drain regions 1604a, 1604c of the driver transistor 1601 is formed on the interlayer film 1606. A laminated layer structured with a Ti, an Al including Ti, and a Ti is formed after, and a conductive film typified by ITO and the like is formed. The laminated layer which consists of Ti, Al including Ti, and Ti, and the conductive film typified by ITO and the like are patterned to a desirable design, thereby wirings 1621 and 1619 constituted by 1617 and 1618, and a pixel electrode 1620 are formed. The pixel electrode 1620 is identical with an anode of a light emitting element 1624.

Next, an insulation film made of an organic resin material such as photosensitive acrylic and the like is formed, an opening portion is formed at a position corresponding to the pixel electrode 1620 of the light emitting element 1624, thereby the insulation film 1610 is formed. In order to avoid problems such as the dispersion of the organic compound layer caused by a level difference in the sidewall of the opening portion, a cut step and the like, the opening portion is formed as there is a sufficient gentle taper shaped sidewall.

After the organic compound layer 1611 is formed, the counter electrode (cathode) 1612 of the light emitting element 1624 is formed from a laminated layer constituted by a cesium (Cs) film at a thickness of 2 nm or less and a silver (Ag) film at a thickness of 10 nm or less in sequence. The film thickness of the counter electrode 1612 of the light emitting element 1624 is reduced extremely so that a light emitted from the light emitting layer 1611 can transmit the counter electrode 1612, and the light emission thereof is in the direction opposite to the pixel substrate 1600. Subsequently, in order to protect the light emitting element 1624, the protection film 1613 is formed.

As described above, in case that the light emission is in the direction opposite to the pixel substrate 1600 in the display device, for the light emitting element 1624, the light emission of the light emitting element 1624 is not necessary to be checked visually via elements including such as the driver transistor 1601 formed on the pixel substrate 1600 side, therefore, the open area ratio thereof can be enlarged.

In the configuration of the FIG. 17B, in comparison with the configuration of FIG. 17A, the wiring 1619 connected to the source or the drain region of the driver transistor and the pixel electrode 1620 can be patterned and formed by using common photomask, therefore, in the manufacture process, the require of photomasks can be reduced, and simplification of process can be applied.

This example can be performed by freely combining with examples 1 to 3.

Example 5

Figure 18:
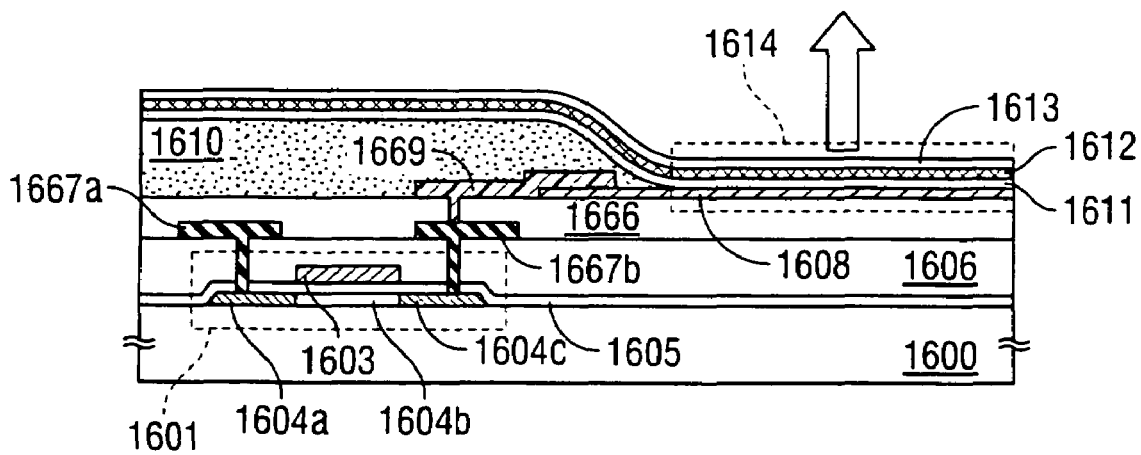
FIG. 18 is a sectional view showing the structure of a display device of the present invention.

In Example 5, the configuration of the pixel of the display device of the present invention which is different from the one shown in FIG. 17 is described by using across-sectional view FIG. 18. Note that the same reference symbols will be used for the same parts in FIG. 17.

In this example, as elements which consist pixels of the display device, only a light emitting element and a transistor connected to the pixel electrode of the light emitting element are illustrated.

In FIG. 18, a transistor (driver transistor) 1601 is formed on a pixel substrate 1600. The driver transistor 1601 includes a gate electrode 1603, an insulation film 1605, and a channel formation region 1604b. One of a drain and a source regions of the driver transistor 1601 is 1604a, the other is 1604c. The channel formation region 1604b and 1604a, 1604c which correspond to the source region and drain region respectively, are formed by a thin film semiconductor layer. An interlayer film 1606 is formed on the driver transistor 1601.

In addition, the driver transistor 1601 is not limited to the structure shown in FIG. 18, any TFTs having well known structure can be freely applied. For example, a signal gate TFT is used as the driver transistor 1601, but a multi gate TFT also may be used. And a top gate TFT is used as the driver transistor 1601 in FIG. 18, but a bottom gate TFT may be used. Moreover, a dual gate TFT in which two gate electrodes are arranged at the above and the below portions of the channel region through a gate insulation film, also is applicable.

A conduct hole is formed to reach the source and the drain regions 1604a, 1604c of the driver transistor 1601 on the interlayer film 1606, a wiring layer is formed and patterned to a desirable design, thereby wirings 1667a and 1667b are formed. Further, a second interlayer 1666 is formed on the wirings 1667a and 1667b.

A laminated layer structured as a Ti, an Al including Ti, and a Ti is formed and patterned to a desirable design, thereby a wiring 1607 and a wiring 1609 are formed. The wiring 1609 and the pixel electrode 1608 become conductive by connecting with each other.

Next, a material with reflectiveness is patterned to a desirable design and a pixel electrode 1608 is formed. The pixel electrode 1608 serves as an anode here. A conduct hole is formed to reach the wiring 1667b on the second interlayer film 1666, the laminated layer structured as a Ti, a Al including Ti, and a Ti is formed and patterned to a desirable design, thereby a wiring 1669 is formed. The wiring 1669 and the pixel electrode 1608 become conductive by connecting with each other.

Subsequently, an insulation film made of an organic resin material such as photosensitive acrylic and the like is formed, an opening portion is formed at a position corresponding to the pixel electrode 1608 of the light emitting element 1614, thereby an insulation film 1610 is formed. In order to avoid problems such as the dispersion of the organic compound layer caused by a level difference in the sidewall of the opening portion, a cut step and the like, as shown in FIG. 17A, the opening portion is formed as there is a sufficient gentle taper shaped sidewall.

Subsequently, after an organic compound layer 1611 is formed, a counter electrode (cathode) 1612 of a light emitting element 1614 is formed from a laminated layer constituted by a cesium (Cs) film at a thickness of 2 nm or less and a silver (Ag) film at a thickness of 10 nm or less in sequence. The film thickness of the counter electrode 1612 of the light emitting element 1614 is reduced extremely so that a light emitted from the light emitting layer 1611 can transmit the counter electrode 1612, and the light emission is in the direction opposite to the pixel substrate 1600. Subsequently, in order to protect the light emitting element 1614, the protection film 1613 is formed.

As described above, in case that the light emission is in the direction opposite to the pixel substrate 1600 in the display device, for the light emitting element 1614, the light emission of the light emitting element 1614 is not necessary to be checked visually via elements including such as the driver transistor 1601 formed on the pixel substrate 1600 side, therefore, the open area ratio thereof can be enlarged.

In addition, a TiN and the like is used as the material for the pixel electrode 1608, and the pixel electrode serves as a cathode, whereas the counter electrode 1612 serves as an anode formed from a transparent conductive film typified by ITO and the like. As thus, it is practicable to take such a structure in which the light emitting layer 1611 emits light from the anode in the direction opposite to the pixel substrate 1600.

In this example, in comparison with the configuration shown in FIG. 17, a wiring layer is increased and the wiring 1667a is formed in FIG. 18. Thus, in comparison with the configuration shown in FIG. 17, in FIG. 18, it is practicable to form pixel electrodes on the upward of the wiring 1667a. Accordingly, the open area ratio can be enlarged. In addition, Example 5 can be performed by freely combining with Examples 1 to 3.

Example 6

In the present Example, an example in which a display device of the present invention is displayed in color will be described below with reference to FIG. 19. In FIG. 19, the sectional view of a pixel of the display device is shown.

In the present Example, only the portion of 3 pixels of an OLED display device is representatively shown, and as an element configuring the respective pixels, only the transistor connected to a luminous element and the pixel electrode of the luminous elements is shown.

In FIG. 19, the transistors (drive transistor) 1901_R, 1901_G and 1901_B are formed on the pixel substrate 1900. The first interlayer film 1910 is formed on the drive transistors 1901_R, 1901_G and 1901_B.

It should be noted that as the drive transistors 1901_R, 1901_G and 1901_B, these are not limited to the configurations shown in FIG. 19, and a TFT of the known configuration can be freely used. For example, in FIG. 19, the drive transistors 1901_R, 1901_G and 1901_B are made as a single gate type TFT, but these may be also a multi-gate type TFT. Moreover, in FIG. 19, the drive transistors 1901_R, 1901_G and 1901_B are made as a top gate type TFT, but these may be also a bottom gate type TFT. Furthermore, these may be also a dual gate type TFT having two gate electrodes separately disposed by a gate insulating film and located above and below the channel region.

In the first interlayer film 1910, a contact hole reaching to the source region or the drain region of the drive transistors 1901_R, 1901_G and 1901_B is formed, the wiring layer is formed, the patterning is performed in the desired shape, the wirings 1919_R, 1919_G and 1919_B are formed. Then, the second interlayer film 1911 is formed on the wirings 1919_R, 1919_G and 1919_B.

Next, a contact hole reaching to the wiring 1919_R, 1919_G and 1919_B are formed and pixel electrodes 1912_R, 1912_G and 1912_B are formed on the second interlayer film 1911. Here, pixel electrodes 1912_R, 1912_G and 1912_B are anodes.

It should be noted that the configuration might be a configuration in which the second interlayer film 1911 is not provided. Specifically, it may be a configuration in which pixel electrodes 1912_R, 1912_G and 1912_B are formed on the same layer with the wirings 1919_R, 1919_G and 1919_B.

Next, a red color luminescent organic compound layer 1914_R is formed. Next, a green color luminescent organic compound layer 1914_G is formed. Next, a blue color luminescent organic compound layer 1914_B is formed. Subsequently, an opposed electrode 1915 of a luminous element 1614 is formed.

In this way, a red color emitting luminous element consisted of the pixel electrode 1912_R, the red color luminescent organic compound layer 1914_R and the opposed electrode 1915 is formed. Moreover, a green color emitting luminous element consisted of the pixel electrode 1912_G, the green color luminescent organic compound layer 1914_G and the opposed electrode 1915 is formed. Then, a blue color emitting luminous element consisted of the pixel electrode 1912_B, the blue color luminescent organic compound layer 1914_B and the opposed electrode 1915 is formed.

As the present Example, when the organic compound layer 1914_R, 1914_G and 1914_B are formed (separately coated), the configuration is made so that the respective organic compound layers 1914_R, 1914_G and 1914_B are superimposed on the boundary.

The margins for separately coating of the organic compound layers are diminished by the above-described configurations, the area of the luminous region in the pixels can be made large.

As for the present Examples, Examples 1-Example 5 are capable of being freely combined and carried out.

Example 7

In Example 7, Examples of electronic apparatuses of the present invention will be described with FIG. 13.

The following can be given as examples of such apparatuses of the present invention: a portable information terminal; a personal computer; an image reproduction device; a television; a head mount display; a video camera and the like.

Figure 13A:
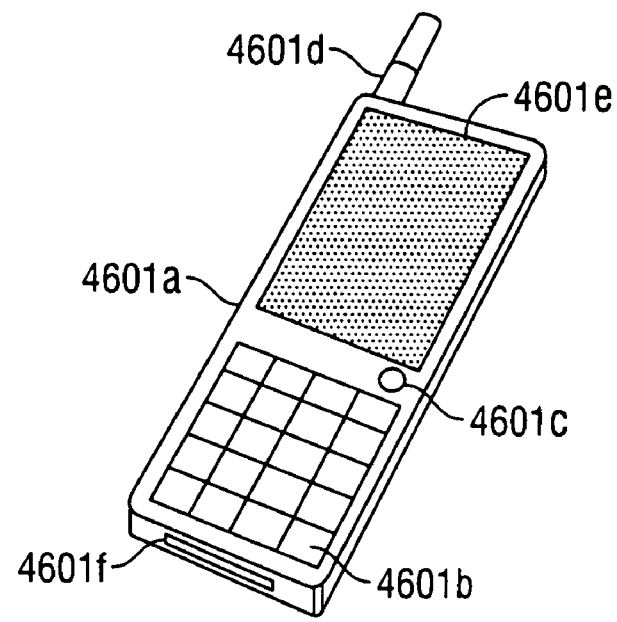
FIG. 13 is a diagram showing an electronic apparatus of the present invention.

FIG. 13A illustrates a diagram of the portable information terminal of the present invention which includes a main body 4601*a*, an operation switch 4601*b*, a power supply switch 4601*c*, an antenna 4601*d*, a display portion 4601*e* and an external input port 4601*f*. A display device described in Embodiments and Examples 1 to 6 is used in the display portion 4601*e*.

Figure 13B:
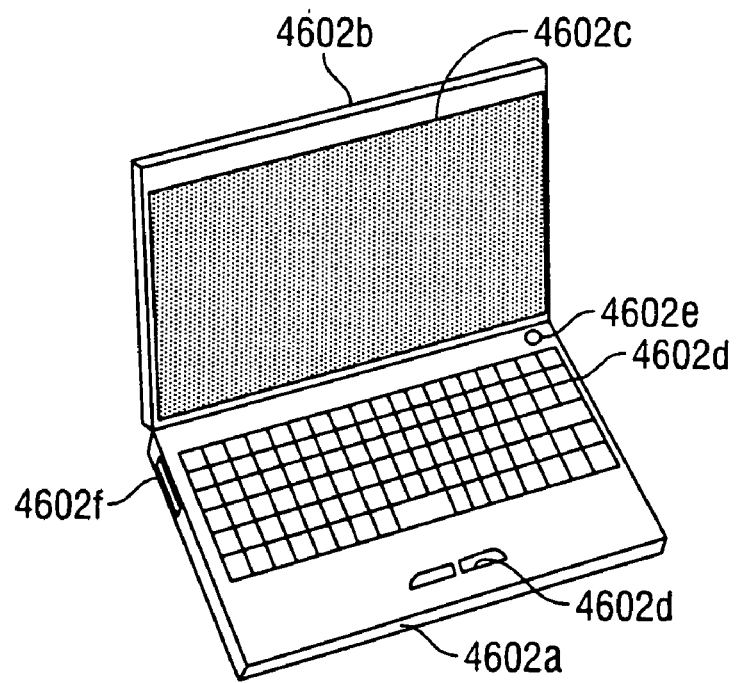

FIG. 13B illustrates a diagram of the personal computer of the present invention which includes a main body 4602*a*, a casing 4602*b*, a display portion 4602*c*, an operation switch 4602*d*, a power supply switch 4602*e* and an external input port 4602*f*. A display device described in Embodiments and Examples 1 to 6 is used in the display portion 4602*c*.

Figure 13C:
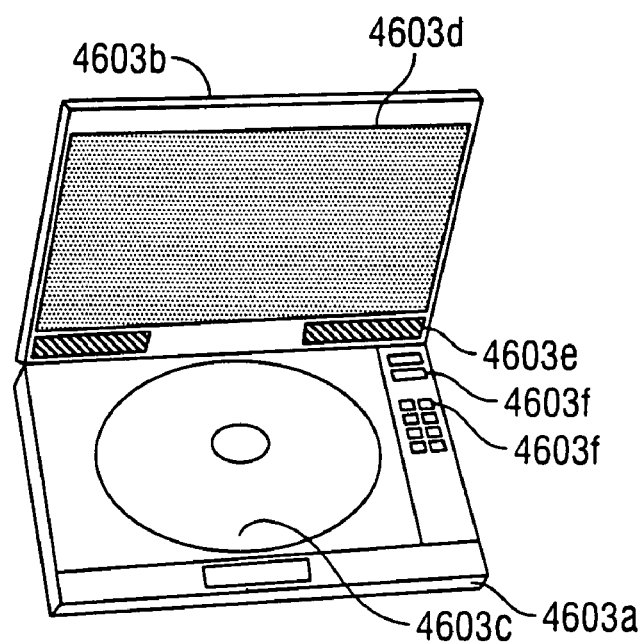

FIG. 13C illustrates a diagram of the image reproduction device of the present invention which includes a main body 4603*a*, a casing 4603*b*, a record medium 4603*c*, a display portion 4603*d*, an sound output portion 4603*e*, an operation switch 4603*f*. A display device described in Embodiments and Examples 1 to 6 is used in the display portion 4604*c*.

Figure 13D:
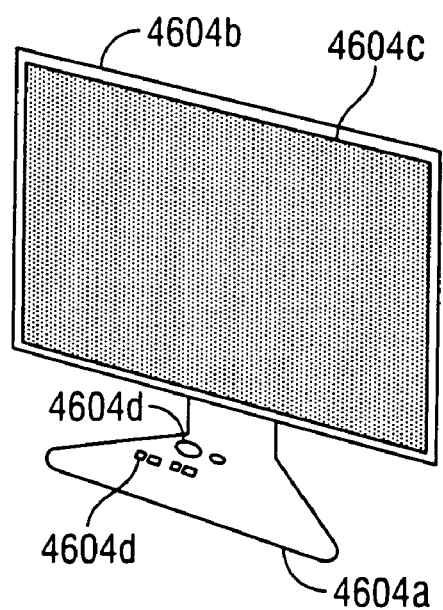

FIG. 13D illustrates a diagram of the television of the present invention which includes a main body 4604*a*, a casing 4604*b*, a display portion 4604*c* and an operation switch 4604*d*. A display device described in Embodiments and Examples 1 to 6 is used in the display portion 4604*c*.

Figure 13E:
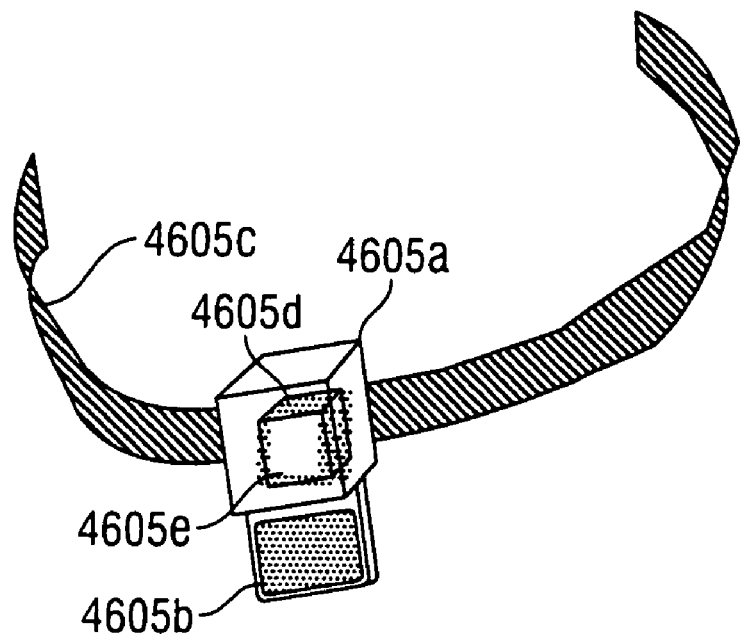

FIG. 13E illustrates a diagram of the head mount display of the present invention which includes a main body 4605*a*, a monitor portion 4605*b*, a band for head fixation 4605*c*, a display portion 4605*d* and an optics system. A display device described in Embodiments and Examples 1 to 6 is used in the display portion 4605*d*.

Figure 13F:
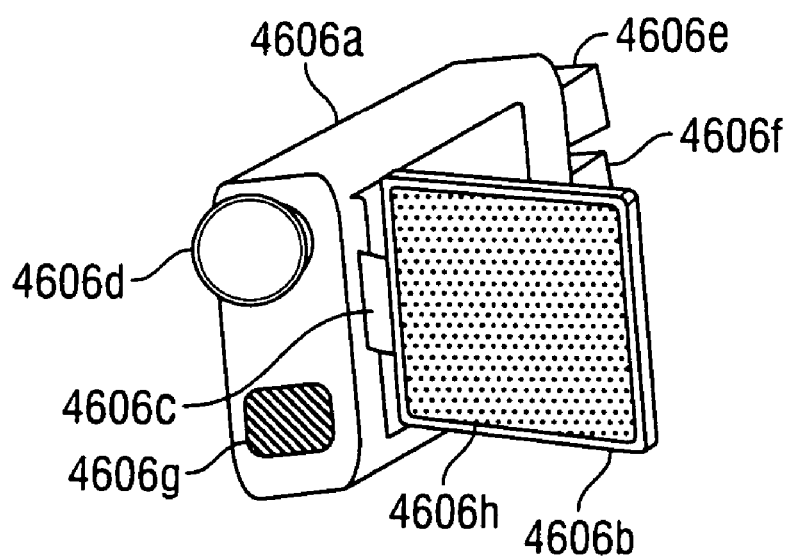

FIG. 13F illustrates a diagram of the video camera of the present invention which includes a main body 4606*a*, a casing 4606*b*, a connection portion 4606*c*, an image receiving portion 4606*d*, an eyepiece 4606*e*, a battery 4606*f*, an sound input portion 4606*g* and a display portion 4606*h*. A display device described in Embodiments and Examples 1 to 6 is used in the display portion 4606*h*. The present invention is not limited to the apparatuses described above. The present invention also can be used in various apparatuses in which the display device described in Embodiments and Examples 1 to 6 is used.

Example 8

In the present Example, an actual configuration of a signal line drive circuit (control current output circuit) of the present invention shown in Embodiment 1 will be described below with reference to FIG. 20.

Figure 20:
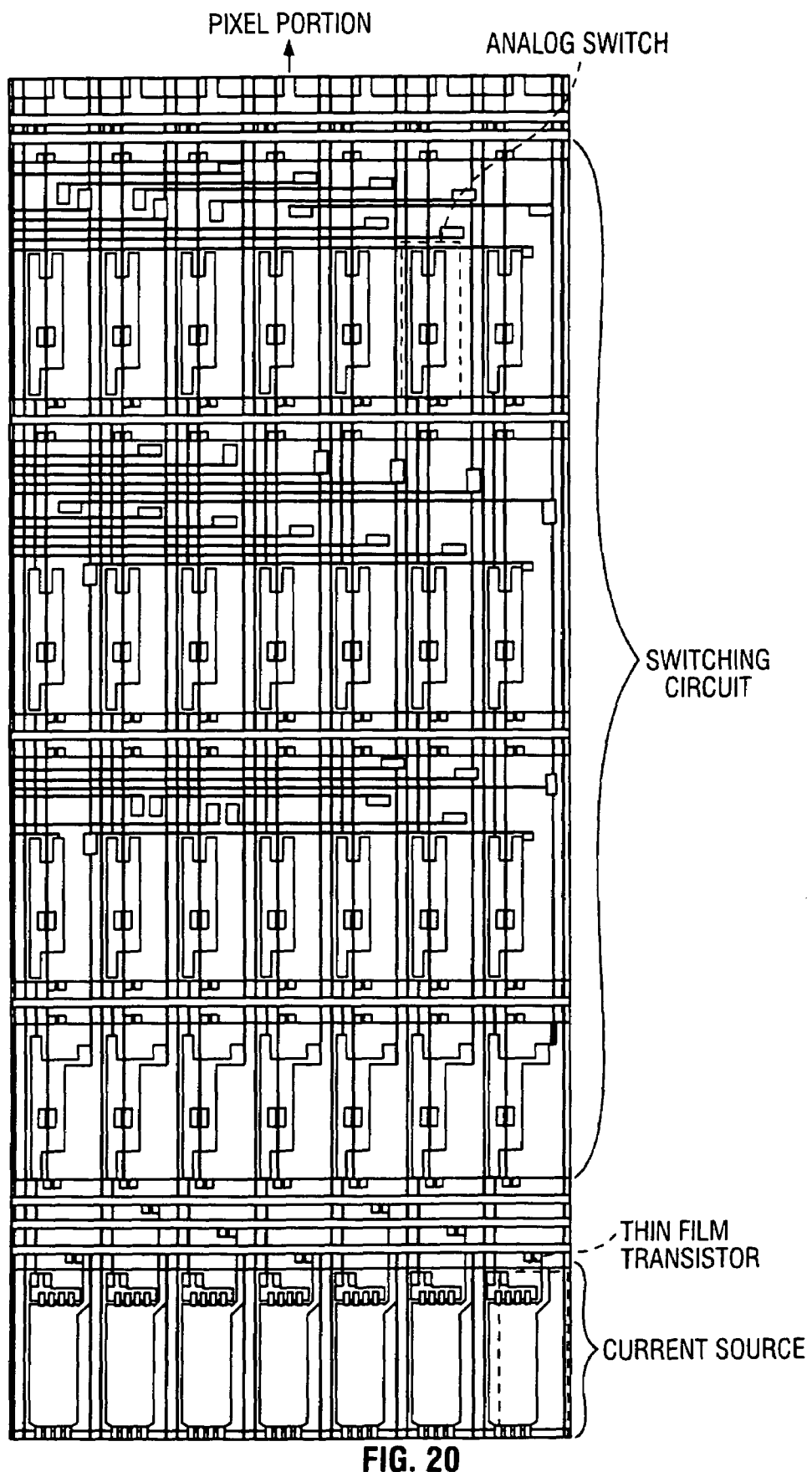
FIG. 20 is a top view showing the structure of a display device of the present invention.

FIG. 20 is a top view of one portion of the signal line drive circuit, a plurality of current sources (corresponding to the quasi control current output circuit 1102 in FIG. 1) and switching circuits connected to the current sources (corresponding to 1101 in FIG. 1) are depicted. It should be noted that although 4 pieces of the transistors (corresponding to 1112 of FIG. 1) are made into one set, since in FIG. 20, the full color display is performed, 12 pieces of transistors disposed for the respective RGB portions are made into one set (however, for the limitation of the drawing, in FIG. 20, only 7 transistors are depicted).

Then, a plurality of analog switches as shown in FIG. 2 are connected to the switching circuits using the wirings. An electric connection to the current line and the signal line (not depicted in FIG. 20) is switched by the connection of this switching circuit, specifically, an analog switch and wiring.

Figure 21A:
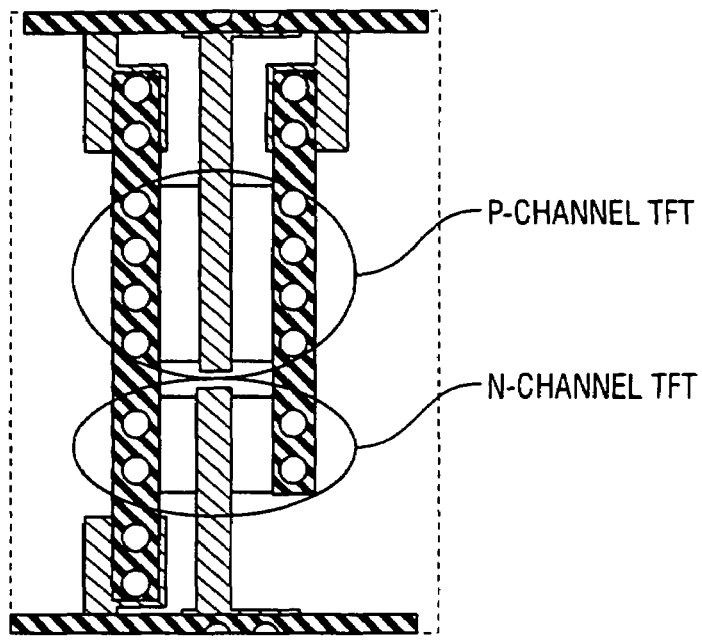
FIGS. 21A and 21B are top views showing the structure of a display device of the present invention.
Figure 21B:
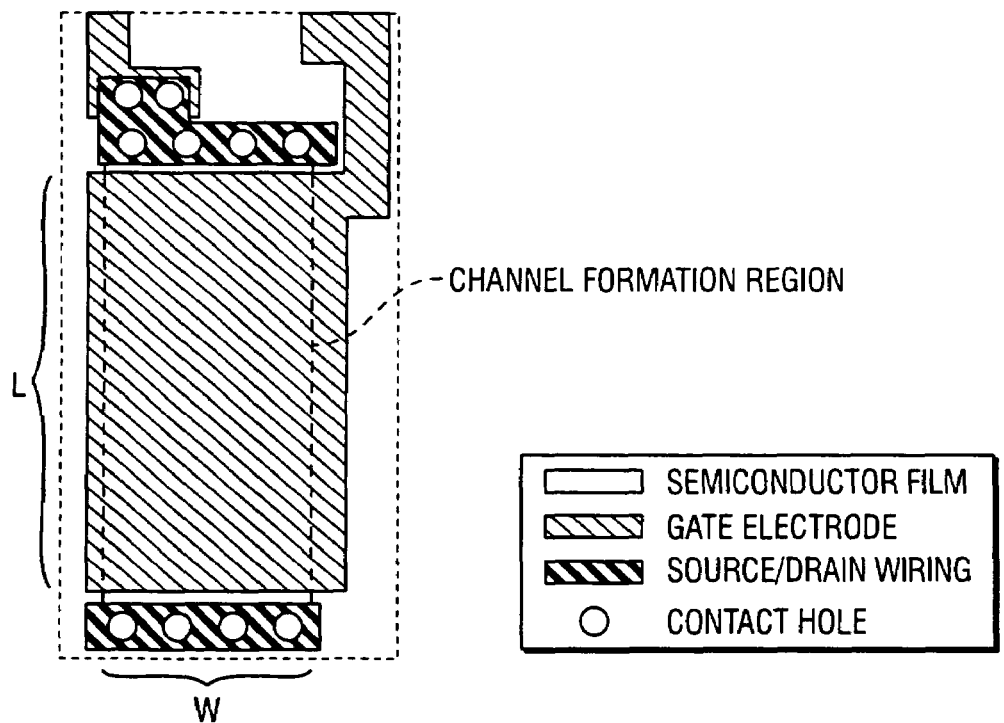

Moreover, in FIG. 21A, an analog switch having an n-channel type thin film transistor and p-channel type thin film transistor is shown. It should be noted that as for a thin film transistor of the current source, for the purpose of reducing the dispersion, the channel length (L) and the channel width (W) of the channel formation region of TFT are largely taken (particularly channel length is made 100 µm).

A p-channel type thin film transistor and an n-channel type thin film transistor described above may be formed using a manufacturing method described in Example 2.

The present invention can provide a control current output circuit, which can be prepared using a polycrystalline TFT with the above-described configurations, and the dispersion of the control current for outputting is suppressed.

Moreover, in a display device using the foregoing control current output circuit, the dispersion of luminous brightness of the luminous elements of the pixel is capable of being visually reduced. In this way, a display device capable of being miniaturized and consuming lower electric power and an electronic apparatus using the display device can be provided.

What is claimed is:

1. A portable information terminal comprising:
    a body;
    an antenna connected to the body; and
    a display connected to the body, the display comprising:
    m (m represents a natural number) pieces of current output circuits provided over an insulating substrate,
    n (n represents a natural number of m or less) pieces of switching means for selecting one from said m pieces of current output circuits, and
    a pixel portion having a plurality of pixels arranged in matrix,
    wherein said pixel portion is electrically connected to said n pieces of switching means, and
    wherein each of said n pieces of switching means has a function for changing periodically the selection opponent of said m pieces of current output circuits.

2. A portable information terminal according to claim 1 wherein each of said m pieces of current output circuits comprises a transistor for supplying an output current of said transistor to said n pieces of said switching means.

3. A portable information terminal according to claim 1 wherein said transistor comprises a polycrystalline semiconductor film.

4. A portable information terminal according to claim 1 further comprising an operation switch.

5. A personal computer comprising:
    a body;
    an operation switch connected to the body; and
    a display connected to the body, the display comprising:
    m (m represents a natural number) pieces of current output circuits provided over an insulating substrate,
    n (n represents a natural number of m or less) pieces of switching means for selecting one from said m pieces of current output circuits, and
    a pixel portion having a plurality of pixels arranged in matrix,
    wherein said pixel portion is electrically connected to said n pieces of switching means, and
    wherein each of said n pieces of switching means has a function for changing periodically the selection opponent of said m pieces of current output circuits.

6. A personal computer according to claim 5 wherein each of said m pieces of current output circuits comprises a transistor for supplying an output current of said transistor to said n pieces of said switching means.

7. A personal computer according to claim 5 wherein said transistor comprises a polycrystalline semiconductor film.

8. An image reproduction device comprising:
    a body;
    a record medium connected to the body; and
    a display connected to the body, the display comprising:
    m (m represents a natural number) pieces of current output circuits provided over an insulating substrate,
    n (n represents a natural number of m or less) pieces of switching means for selecting one from said m pieces of current output circuits, and
    a pixel portion having a plurality of pixels arranged in matrix,
    wherein said pixel portion is electrically connected to said n pieces of switching means, and
    wherein each of said n pieces of switching means has a function for changing periodically the selection opponent of said m pieces of current output circuits.

9. An image reproduction device according to claim 8 wherein each of said m pieces of current output circuits comprises a transistor for supplying an output current of said transistor to said n pieces of said switching means.

10. An image reproduction device according to claim 9 wherein said transistor comprises a polycrystalline semiconductor film.

11. An Image reproduction device according to claim 8 further comprising a sound output portion.

12. An image reproduction device according to claim 11 further comprising an operation switch.

13. A television comprising:
    a body,
    an operation switch connected to the body; and
    a display connected to the body, the display comprising:
    m (m represents a natural number) pieces of current output circuits provided over an insulating substrate,
    n (n represents a natural number of m or less) pieces of switching means for selecting one from said m pieces of current output circuits, and
    a pixel portion having a plurality of pixels arranged in matrix,
    wherein said pixel portion is electrically connected to said n pieces of switching means, and
    wherein each of said n pieces of switching means has a function for changing periodically the selection opponent of said m pieces of current output circuits.

14. A television according to claim 13 wherein each of said m pieces of current output circuits comprises a transistor for supplying an output current of said transistor to said n pieces of said switching means.

15. A television according to claim 14 wherein said transistor comprises a polycrystalline semiconductor film.

16. A head mount display comprising:
    a body,
    an optics system connected to the body; and
    a display connected to the body, the display comprising:
    m (m represents a natural number) pieces of current output circuits provided over an insulating substrate,
    n (n represents a natural number of m or less) pieces of switching means for selecting one from said m pieces of current output circuits, and
    a pixel portion having a plurality of pixels arranged in matrix,
    wherein said pixel portion is electrically connected to said n pieces of switching means, and
    wherein each of said n pieces of switching means has a function for changing periodically the selection opponent of said m pieces of current output circuits.

17. A head mount display according to claim 16 wherein each of said m pieces of current output circuits comprises a transistor for supplying an output current of said transistor to said n pieces of said switching means.

18. A head mount display according to claim 17 wherein said transistor comprises a polycrystalline semiconductor film.

19. A camera comprising:
a body,
an image receiving portion connected to the body; and
a display connected to the body, the display comprising:
m (m represents a natural number) pieces of current output circuits provided over an insulating substrate,
n (n represents a natural number of m or less) pieces of switching means for selecting one from said m pieces of current output circuits, and
a pixel portion having a plurality of pixels arranged in matrix,
wherein said pixel portion is electrically connected to said n pieces of switching means, and
wherein each of said n pieces of switching means has a function for changing periodically the selection opponent of said m pieces of current output circuits.

20. A camera according to claim 19 wherein each of said m pieces of current output circuits comprises a transistor for supplying an output current of said transistor to said n pieces of said switching means.

21. A camera according to claim 20 wherein said transistor comprises a polycrystalline semiconductor film.

22. A camera according to claim 19 wherein said camera is a video camera.

23. A camera according to claim 19 further comprising an eyepiece.

24. A camera according to claim 19 further comprising a battery.

25. A camera according to claim 19 further comprising a sound input portion.

26. A semiconductor device comprising:
m (m represents a natural number) pieces of current output circuits provided over an insulating substrate,
n (n represents a natural number of m or less) pieces of switching means for selecting one from said m pieces of current output circuits, and
a pixel portion having a plurality of pixels arranged in matrix,
wherein said pixel portion is electrically connected to said n pieces of switching means, and
wherein each of said n pieces of switching means has a function for changing periodically the selection opponent of said m pieces of current output circuits.

27. A display device according to claim 26 wherein each of said m pieces of current output circuits comprises a transistor for supplying an output current of said transistor to said n pieces of said switching means.

28. A display device according to claim 27 wherein said transistor comprises a polycrystalline semiconductor film.

29. A semiconductor device comprising:
a first current output circuit;
a second current output circuit;
a third current output circuit;
a first wiring;
a second wiring;
a third wiring;
a first switch electrically connected between the first current output circuit and the first wiring;
a second switch electrically connected between the second current output circuit and the first wiring;
a third switch electrically connected between the first current output circuit and the second wiring;
a fourth switch electrically connected between the second current output circuit and the second wiring;
a fifth switch electrically connected between the third current output circuit and the second wiring;
a sixth switch electrically connected between the second current output circuit and the third wiring; and
a seventh switch electrically connected between the third current output circuit and the third wiring.

30. A semiconductor device according to claim 29 further comprising a pixel portion having a plurality of pixels arranged in matrix, wherein the pixel portion is electrically connected to the first to third wirings.

31. A semiconductor device according to claim 30, wherein the pixel portion comprises a first thin film transistor.

32. A semiconductor device according to claim 31, wherein each of the first to third current output circuits comprises a second thin film transistor.

* * * * *